(12) United States Patent
Jung et al.

(10) Patent No.: US 9,996,007 B2
(45) Date of Patent: Jun. 12, 2018

(54) POLYMER FOR PREPARING RESIST UNDERLAYER FILM, RESIST UNDERLAYER FILM COMPOSITION CONTAINING THE POLYMER AND METHOD FOR MANUFACTURING SEMICONDUCTOR DEVICE USING THE COMPOSITION

(71) Applicants: SK Innovation Co., Ltd., Seoul (KR); SK Global Chemical Co., Ltd., Seoul (KR)

(72) Inventors: Min Ho Jung, Daejeon (KR); Yu Na Shim, Daejeon (KR); Kyun Phyo Lee, Daejeon (KR); Jin Su Ham, Daejeon (KR); Soo Young Hwang, Daejeon (KR)

(73) Assignees: SK Innovation Co., Ltd., Seoul (KR); SK Global Chemical Co., Ltd., Seoul (KR)

( * ) Notice: Subject to any disclaimer, the term of this patent is extended or adjusted under 35 U.S.C. 154(b) by 78 days.

(21) Appl. No.: 15/207,817

(22) Filed: Jul. 12, 2016

(65) Prior Publication Data
US 2017/0015779 A1  Jan. 19, 2017

(30) Foreign Application Priority Data
Jul. 14, 2015 (KR) ........................ 10-2015-0099736

(51) Int. Cl.
| | | |
|---|---|---|
| G03F 7/09 | (2006.01) |
| C09D 165/00 | (2006.01) |
| C08G 61/12 | (2006.01) |
| G03F 7/11 | (2006.01) |
| G03F 7/38 | (2006.01) |
| C09D 149/00 | (2006.01) |
| C08G 10/00 | (2006.01) |
| C08G 65/40 | (2006.01) |
| H01L 21/027 | (2006.01) |
| H01L 21/033 | (2006.01) |
| H01L 21/311 | (2006.01) |

(52) U.S. Cl.
CPC .............. *G03F 7/38* (2013.01); *C08G 10/00* (2013.01); *C08G 65/4012* (2013.01); *C09D 149/00* (2013.01); *G03F 7/091* (2013.01); *G03F 7/094* (2013.01); *H01L 21/0271* (2013.01); *H01L 21/0332* (2013.01); *H01L 21/31138* (2013.01)

(58) Field of Classification Search
CPC . G03F 7/38; G03F 7/11; G03F 7/2053; G03F 7/168; G03F 7/322; G03F 7/091; G03F 7/094; H01L 21/0332; H01L 21/0271; H01L 21/31138; C08G 10/00; C08G 2650/02; C08G 65/4012; C09D 149/00; C09D 161/18
See application file for complete search history.

(56) References Cited

U.S. PATENT DOCUMENTS

| | | | |
|---|---|---|---|
| 6,117,967 A | 9/2000 | Fuller et al. | |
| 2004/0122204 A1* | 6/2004 | Bender | C08G 65/4012 528/125 |
| 2007/0275325 A1 | 11/2007 | Hatakeyama et al. | |
| 2015/0368504 A1 | 12/2015 | Aqad et al. | |
| 2017/0015785 A1* | 1/2017 | Jung | C08G 65/4012 |

FOREIGN PATENT DOCUMENTS

KR  1020140123368 A  10/2014

OTHER PUBLICATIONS

Brandukova-Szmikowski et al.; "Synthesis of OH-functionalized poly(p-xylylene)s by reductive coupling polymerization of aromatic dialdehydes with stoichiometric amounts of divalent samarium compounds"; Acta Polym; 1999; pp. 35-39; vol. 50.

* cited by examiner

*Primary Examiner* — Cynthia Hamilton
(74) *Attorney, Agent, or Firm* — The Webb Law Firm

(57) ABSTRACT

Provided are a polymer used for a manufacturing process of a semiconductor and a display, a resist underlayer film composition containing the polymer for a manufacturing process of a semiconductor and a display, and a method for manufacturing semiconductor device using the composition, and more specifically, the polymer of the present disclosure simultaneously has optimized etching selectivity, planarization characteristic, and excellent thermal resistance, such that the resist underlayer film composition containing the polymer is usable as a hard mask for a multilayer semiconductor lithography process.

14 Claims, 1 Drawing Sheet

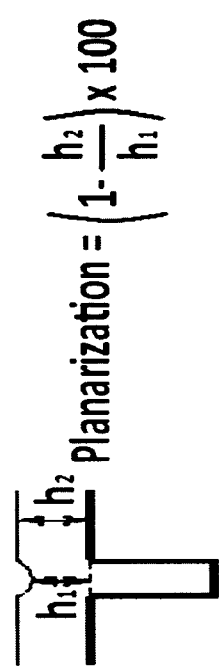

POLYMER FOR PREPARING RESIST UNDERLAYER FILM, RESIST UNDERLAYER FILM COMPOSITION CONTAINING THE POLYMER AND METHOD FOR MANUFACTURING SEMICONDUCTOR DEVICE USING THE COMPOSITION

CROSS-REFERENCE TO RELATED APPLICATION

This application claims priority to Korean Patent Application No. 10-2015-0099736 filed Jul. 14, 2015, the disclosure of which is hereby incorporated in its entirety by reference.

TECHNICAL FIELD

The following disclosure relates to a novel polymer used for a manufacturing process of a semiconductor and a display, a resist underlayer film composition containing the polymer for a manufacturing process of a semiconductor and a display, and a method for manufacturing semiconductor device using the composition, and more specifically, the novel polymer of the present disclosure simultaneously has optimized etching selectivity, planarization characteristic, and excellent thermal resistance, such that the resist underlayer film composition containing the polymer is usable as a hard mask for a multilayer semiconductor lithography process.

BACKGROUND

As size of patterns is rapidly decreased in accordance with miniaturization and high integration of semiconductor devices, a collapse phenomenon of photoresist patterns has emerged as the hardest part during processes, and accordingly, it is inevitable that a thickness of a photoresist film becomes gradually thinner to achieve a high resolution image. However, since it is difficult to etch a layer to be etched with sufficient etching selectivity by using patterns formed with a thinner photoresist, an inorganic or organic film having strong etching resistance is introduced between the layer to be etched and the photoresist. This inorganic or organic film refers to a hard mask, and a hard mask process refers to a general process of etching the hard mask using the photoresist patterns to perform patterning, and etching the layer to be etched using the patterns of the hard mask. The hard mask used for the hard mask process is formed by using various films such as polysilicon, silicon nitride, silicon oxynitride, titanium nitride, amorphous carbon, etc., and is conventionally manufactured by chemical vapor deposition (CVD).

The hard mask formed by the chemical vapor deposition has good physical properties in view of etching selectivity or etching resistance, but has problems such as particle occurrence, void occurrence in a part having large steps, etc., particularly, high investment cost for initial equipment. In order to solve these problems, a need for developing a spin-on hard mask composition that is easily capable of performing spin-coating using a track system used in a photolithography process in a semiconductor line instead of using the deposited hard mask has emerged, and development of specific materials for solving these problems has been attempted. The hard mask (spin-on hard mask) formed by the spin-coating has difficulty in obtaining the same etching resistance as the hard mask formed by a CVD process. However, the hard mask formed by the spin-coating has advantages in that it is easier to form a thin film by a solution stage of coating, and coating uniformity and roughness of a thin film surface are improved, etc. In addition, the initial investment cost of the hard mask formed by the spin-coating is less than that of the hard mask formed by a CVD process.

As described above, the recent trend of miniaturization of a lithography process according to continuous high integration of an LSI (large scale integrated) circuit has reached the limit for being implemented as an argon fluoride immersion lithography photoresist which is the top in the existing photoresist. In particular, in order to perform an ultrafine patterning process of 30 nm node or less, resolution of the photoresist used in the lithography process functions as an important factor. However, since the existing photoresist has a limitation in implementing patterns of 30 nm or less, development of a novel additional process has been attempted to overcome the limitation.

Technologies that are practically applied among a number of currently developed technologies are mainly a double patterning method in which primary and secondary exposure processes and an etching process are performed and a double patterning process (SPT, Spacer Patterning Technology) using a spacer, and materials used as a hard mask in the additional process commonly refer to an underlayer film composition. It is noted that in addition to the use of amorphous carbon as a hard mask, the used amount of the underlayer film composition has rapidly increased as a novel hard mask material in a situation in which the double patterning process which is a process for implementing new high resolution generally leads in the industry for an ArF lithography process. The main physical properties that are required for the underlayer film include high etching resistance, thermal stability, excellent solubility to general organic solvents, storage stability, adhesion property, and excellent coating uniformity, etc. The reason for requiring thermal stability is that an underlayer film is formed, and then, a vacuum deposition process at high temperature is performed on an upper part thereof as a subsequent process, wherein in view of thermal resistance, low decomposition of a polymer at 400° C. and a film decrease by 5% or less are generally required for a stable vacuum deposition process. The etching resistance is another factor that is significantly important for etching an underlayer (substrate) while having the minimum thickness as the underlayer film. The reason is because as a thickness of the film is increased, risk that patterns may naturally collapse during the process is increased. The etching resistance is favorable as carbon content of a polymer is high, but it is preferred that the carbon content of the polymer is 82% or more in consideration of solubility to a solvent, coating uniformity, etc.

In the related art, polymers having high carbon content and polarity and high thermal stability have been mainly studied as a polymer material in a composition in order to satisfy characteristics of the underlayer film material as described above, and in particular, polyamide, polyetheretherketone, polyaryl ether, other phenolic polymers, etc., have been variously studied. It was confirmed that some of the polymers had sufficient high-temperature stability and a film-forming ability. However, when polymers have desired level of carbon contents related with etching resistance, the polymers have problems in view of storage stability, line compatibility, and coating uniformity due to rapid decrease in solubility. When polymers have insufficient thermal resistance, the polymers have a problem in that a gas emission amount is large during the process due to low thermal stability.

That is, physical properties of the underlayer film composition are dependent on characteristics of the polymer. In particular, thermal stability and etching resistance in the characteristics of the polymer are intactly reflected in the characteristics of the underlayer film composition. The thermal stability is dependent on stability of a polymer main chain, and the etching resistance is excellent as carbon content present in the polymer is high. Examples of the polymer having excellent thermal stability may include polyimide, polyamide, polyarylketone ether, etc. However, the polymers having excellent thermal stability have limitation in being used as the underlayer film material since etching resistance is decreased or solubility with respect to general organic solvents is low.

In addition, surface planarization and uniformity of pattern edges may be controlled by a molecular weight of the polymer or an additive. Other mechanical properties of the pattern are also determined by kinds and structures of the polymer.

RELATED ART DOCUMENT (Patent Document 1) Korean Patent Laid-Open Publication No. KR 10-2014-0123368
(Patent Document 2) U.S. Patent Application Publication No. 2007-0275325A1

SUMMARY

The present inventors synthesized a novel polymer capable of improving etching resistance while having excellent thermal stability and coating uniformity to overcome the above-described problems, and found that the novel polymer had excellent thermal stability, etching resistance, and coating uniformity, and simultaneously had high solubility to organic solvents conventionally used in a semiconductor process even though the polymer had high carbon content, thereby remarkably improving storage stability and line compatibility, and completed the present disclosure.

An embodiment of the present disclosure is directed to providing a polymer for preparing a resist underlayer film having excellent thermal stability, etching resistance, and coating uniformity.

Another embodiment of the present disclosure is directed to providing a resist underlayer film composition containing the polymer for preparing the resist underlayer film to thereby have excellent thermal stability, etching resistance, surface planarization, and gap-fill characteristic and superior mechanical properties of patterns.

Still another embodiment of the present disclosure is directed to providing a method for manufacturing semiconductor device using the resist underlayer film composition.

In one general aspect, there is provided a polymer for preparing a resist underlayer film including: a repeating unit represented by Chemical Formula 1 below:

[Chemical Formula 1]

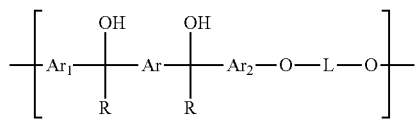

in Chemical Formula 1,
Ar is (C10-C100)arylene, wherein the arylene of Ar may further include carbonyl, amino, oxygen, sulfur, and may be further substituted with one or more substituents selected from the group consisting of (C1-C20)alkyl, (C3-C20)cycloalkyl, (C2-C20)alkenyl, (C3-C20)cycloalkenyl, (C2-C20)alkynyl, 4- to 10-membered heterocycloalkyl, (C6-C20)aryl, (C3-C20)heteroaryl, halogen, cyano, hydroxy, (C1-C20)alkoxy, (C3-C20)cycloalkoxy, (C6-C20)aryloxy, (C1-C20)alkylthio, (C3-C20)cycloalkylthio, (C6-C20)arylthio, (C1-C20)alkylcarbonyl, (C2-C20)alkenylcarbonyl, (C6-C20)arylcarbonyl, (C3-C20)cycloalkylcarbonyl, and (C3-C20)cycloalkenylcarbonyl;

$Ar_1$ and $Ar_2$ are each independently (C6-C30)arylene;

L is

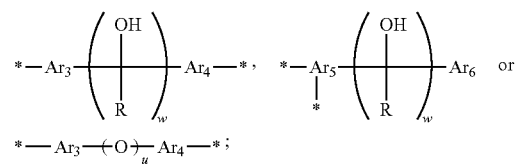

$Ar_3$ and $Ar_4$ are each independently (C6-C30)arylene;

$Ar_5$ is trivalent (C6-C30)arylene;

$Ar_6$ is (C6-C30)aryl;

the arylene of $Ar_3$, $Ar_4$ and $Ar_5$, and the aryl of $Ar_6$ may be further substituted with one or more substituents selected from the group consisting of (C1-C10)alkyl, (C3-C10)cycloalkyl, (C6-C20)aryl, (C1-C10)alkoxy, (C6-C20)aryloxy, (C1-C10)alkyl(C6-C20)aryl and (C6-C20)aryl(C1-C10)alkyl, R is hydrogen, (C1-C20)alkyl, (C3-C10)cycloalkyl or (C6-C20)aryl, and the alkyl, cycloalkyl, or aryl of R may be further substituted with one or more substituents selected from the group consisting of (C1-C10)alkyl, (C3-C10)cycloalkyl and (C6-C20)aryl;

w is an integer of 1 to 5;

u is an integer of 0 or 1; and the heteroaryl and the heterocycloalkyl include one or more heteroatoms selected from B, N, O, S, P(=O), Si, Se and P.

In addition, in another general aspect, there is provided a resist underlayer film composition containing the polymer for preparing the resist underlayer film including the repeating unit represented by Chemical Formula 1; and an organic solvent.

Further, in another general aspect, there is provided a method for forming a resist underlayer film including: a) applying the resist underlayer film composition as described above on a substrate, the resist underlayer film composition including the polymer for preparing the resist underlayer film including the repeating unit represented by Chemical Formula 1; and the organic solvent; and b) forming a resist underlayer film by heating the substrate of step a).

In addition, in another general aspect, there is provided a method for manufacturing semiconductor device including: 1) forming a resist underlayer film by applying and heating the resist underlayer film composition as described above on a substrate; 2) forming a photoresist film on the resist underlayer film of step 1); 3) forming photoresist patterns by exposing and developing the substrate to which the resist underlayer film and the photoresist film of step 2) are applied; 4) etching the resist underlayer film by using the photoresist patterns of step 3) as an etching mask to thereby expose the substrate in a form of the patterns; and 5) etching an exposed part of the substrate.

BRIEF DESCRIPTION OF THE DRAWINGS

FIG. 1 is a depiction of Calculation Formula 1.

DETAILED DESCRIPTION OF EMBODIMENTS

Hereinafter, the present disclosure will be described in detail.

The present disclosure provides a polymer for preparing a resist underlayer film including a repeating unit represented by Chemical Formula 1 below, as a core material for preparing a composition having excellent physical properties of an underlayer film used in a manufacturing process of a semiconductor and a display:

[Chemical Formula 1]

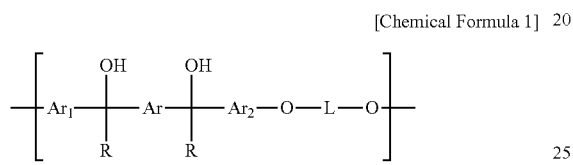

in Chemical Formula 1,

Ar is (C10-C100)arylene, wherein the arylene of Ar may further include carbonyl, amino, oxygen, sulfur, and may be further substituted with one or more substituents selected from the group consisting of (C1-C20)alkyl, (C3-C20)cycloalkyl, (C2-C20)alkenyl, (C3-C20)cycloalkenyl, (C2-C20)alkynyl, 4- to 10-membered heterocycloalkyl, (C6-C20)aryl, (C3-C20)heteroaryl, halogen, cyano, hydroxy, (C1-C20)alkoxy, (C3-C20)cycloalkoxy, (C6-C20)aryloxy, (C1-C20)alkylthio, (C3-C20)cycloalkylthio, (C6-C20)arylthio, (C1-C20)alkylcarbonyl, (C2-C20)alkenylcarbonyl, (C6-C20)arylcarbonyl, (C3-C20)cycloalkylcarbonyl, and (C3-C20)cycloalkenylcarbonyl;

$Ar_1$ and $Ar_2$ are each independently (C6-C30)arylene; L is

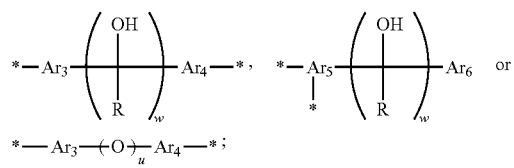

$Ar_3$ and $Ar_4$ are each independently (C6-C30)arylene;
$Ar_5$ is trivalent (C6-C30)arylene;
$Ar_6$ is (C6-C30)aryl;
the arylene of $Ar_3$, $Ar_4$ and $Ar_5$, and the aryl of $Ar_6$ may be further substituted with one or more substituents selected from the group consisting of (C1-C10)alkyl, (C3-C10)cycloalkyl, (C6-C20)aryl, (C1-C10)alkoxy, (C6-C20)aryloxy, (C1-C10)alkyl(C6-C20)aryl and (C6-C20)aryl(C1-C10)alkyl, R is hydrogen, (C1-C20)alkyl, (C3-C10)cycloalkyl or (C6-C20)aryl, and the alkyl, cycloalkyl, or aryl of R may be further substituted with one or more substituents selected from the group consisting of (C1-C10)alkyl, (C3-C10)cycloalkyl and (C6-C20)aryl;

w is an integer of 1 to 5;
u is an integer of 0 or 1; and the heteroaryl and the heterocycloalkyl include one or more heteroatoms selected from B, N, O, S, P(=O), Si, Se and P.

More preferably, the polymer for preparing a resist underlayer film according to the present disclosure may be a polymer including a repeating unit represented by Chemical Formula 2, 3, or 4 below:

[Chemical Formula 2]

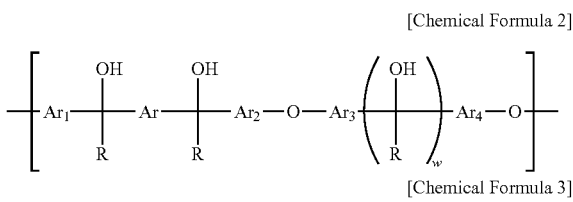

[Chemical Formula 3]

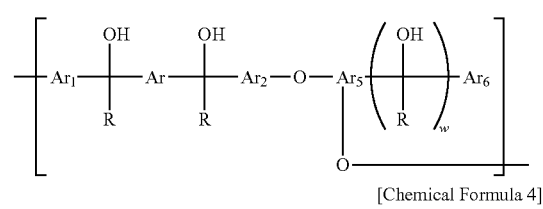

[Chemical Formula 4]

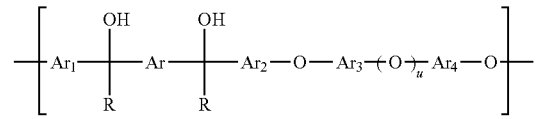

in Chemical Formula 2, 3, or 4, Ar, $Ar_1$, $Ar_2$, $Ar_3$, $Ar_4$, $Ar_5$, $Ar_6$, R, w and u are the same as defined in Chemical Formula 1 above.

The polymer for preparing a resist underlayer film according to the present invention may have excellent etching resistance and coating uniformity, and further, may have excellent thermal stability due to at least two hydroxy groups in the repeating unit, and may have excellent solubility to organic solvents even though the polymer has high carbon content, thereby effectively forming the resist underlayer film by a spin-on coating method. In addition, when the polymer is formed on the underlayer film having predetermined patterns by the spin-on coating method, the resist underlayer film containing the polymer has an excellent gap-fill characteristic capable of filling a gap between the patterns and a planarization characteristic, and is usable as a hard mask for a multilayer semiconductor lithography process. Further, the polymer for preparing a resist underlayer film according to the present disclosure may have excellent solubility to organic solvents even though the polymer has high carbon content, thereby improving storage stability.

Terms ⌜alkyl⌟ and ⌜alkoxy⌟ described in the present disclosure include both a linear type or a branched type.

Term ⌜aryl⌟ described in the present disclosure is an organic radical derived from aromatic hydrocarbon by removal of one hydrogen, and includes a single ring system or a fused ring system including 4 to 7 ring atoms, preferably, 5 or 6 ring atoms in each ring, and even includes a form in which a plurality of aryls are connected by a single bond. The fused ring system may include an aliphatic ring such as a saturated or partially saturated ring, and necessarily includes at least one aromatic ring. In addition, the aliphatic ring may include nitrogen, oxygen, sulfur, carbonyl, etc., in a ring. Specific examples of the aryl radical include phenyl, naphthyl, biphenyl, indenyl, fluorenyl, phenanthrenyl, anthracenyl, triphenylenyl, pyrenyl, chrysenyl, naphthacenyl, 9,10-dihydroanthracenyl, etc.

Term 「arylene」 described in the present disclosure is an organic radical derived from aromatic hydrocarbon by removal of two hydrogens, and term 「trivalent arylene」 is an organic radical derived from aromatic hydrocarbon by removal of three hydrogens.

Term 「heteroaryl」 described in the present disclosure means an aryl group containing 1 to 4 heteroatoms selected from B, N, O, S, P(=O), Si and P as aromatic ring backbone atoms and carbon as remaining aromatic ring backbone atoms, and may include 5- to 6-membered monocyclic heteroaryl and polycyclic heteroaryl condensed with at least one benzene ring, and may be partially saturated. In addition, the heteroaryl in the present disclosure includes even a form in which one or more heteroaryls are connected by a single bond. Examples of the heteroaryl radical may include imidazolyl, oxazolyl, pyrazinyl, thiophenyl, quinolyl, benzofuryl, pyridiyl, indolyl, pyrrolyl, pyranyl, naphthyridinyl, etc., but the examples of the heteroaryl radical are not limited thereto.

Term 「cycloalkyl」 described in the present disclosure means a monovalent alicyclic alkyl radical consisting of one ring. Examples of cycloalkyl may include cyclopropyl, cyclobutyl, cyclopentyl, cyclohexyl, cycloheptyl, cyclooctyl, cyclononyl, cyclodecyl, etc., but examples of the cycloalkyl are not limited thereto.

The 「heterocycloalkyl」 described in the present disclosure means a completely saturated and partially unsaturated monocyclic or polycyclic hydrocarbon ring including at least one heteroatom selected from N, O, S, P(=O), Si, Se and P in a ring as the heteroatom, wherein the number of heteroatoms is 1 to 4, and preferably, 1 to 2. Examples of the heterocyloalkyl radical may include morpholinyl, piperazinyl, piperidinyl, pyrrolidinyl, tetrahydropyranyl, thiomorpholinyl, etc., but the examples of the heterocycloalkyl radical are not limited thereto.

Term 「alkenyl」 described in the present disclosure means a linear or branched hydrocarbon radical containing at least one carbon-carbon double bond, and includes ethenyl, propenyl, butenyl, pentenyl, etc., but the examples of the alkenyl are not limited thereto.

Term 「alkynyl」 described in the present disclosure means a linear or branched hydrocarbon radical containing at least one carbon-carbon triple bond, and includes ethynyl, propynyl, butynyl, pentynyl, etc., but the examples of the alkynyl are not limited thereto.

Term 「cycloalkenyl」 described in the present disclosure means a non-aromatic monocyclic or polycyclic hydrocarbon ring radical containing at least one carbon-carbon double bond, and examples of the cycloalkenyl group include cyclopentenyl, cyclobutenyl, cyclohexenyl, etc., without limitation, and the examples of the cycloalkenyl are not limited thereto.

A polystyrene-conversion weight average molecular weight (Mw) by gel permeation chromatography (GPC) of the polymer for preparing the resist underlayer film according to an exemplary embodiment of the present disclosure may be 500 or more, but may be 500 to 50,000, and more preferably, 700 to 20,000 in view of improvement in preparation of the underlayer film composition, easiness of handling, film formation, coating uniformity, hole filling characteristic, and solubility. When the weight average molecular weight of the polymer is less than 500, coating uniformity may be deteriorated.

In Chemical Formula 1, Ar is (C10-C100)arylene, and includes a single ring system or a fused ring system including 4 to 7 ring atoms, preferably, 5 or 6 ring atoms in each ring, and even includes a form in which a plurality of aryls are connected by a single bond. The fused ring system may include an aliphatic ring such as a saturated or partially saturated ring, and necessarily includes at least two aromatic ring. In addition, the aliphatic ring may include nitrogen, oxygen, sulfur, carbonyl, etc., in a ring.

In the polymer for preparing a resist underlayer film according to the present disclosure, *-Ar-* may be selected from the following structures, but is not limited thereto:

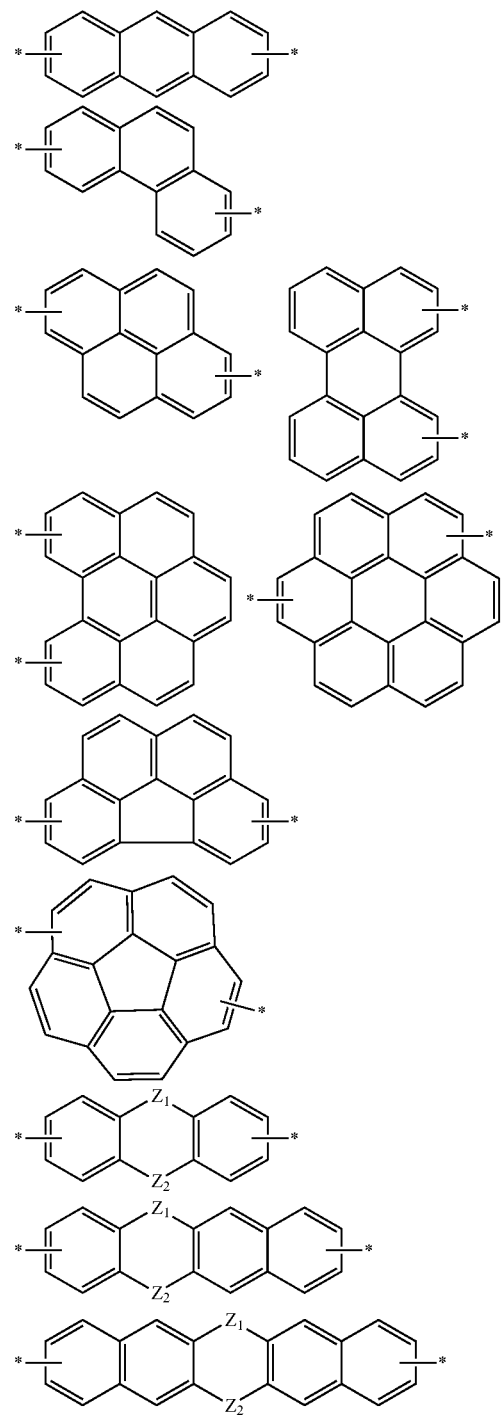

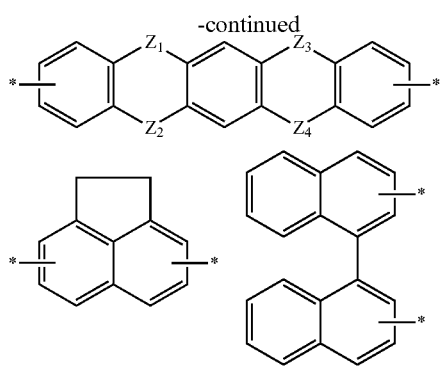

$Z_1$ to $Z_4$ are each independently C=O, $NR^a$, O, S or $CR^bR^c$; $R^a$ to $R^c$ are each independently hydrogen, (C1-C10) alkyl, halogen, (C3-C10)cycloalkyl or (C6-C20)aryl, and the alkyl, cycloalkyl and aryl may be further substituted with one or more substituents selected from the group consisting of halogen, (C1-C10)alkyl, halo(C1-C10)alkyl, (C3-C10) cycloalkyl and (C6-C20)aryl.

In addition, in the polymer for preparing the resist underlayer film according to the present disclosure, $Ar_3$ and $Ar_4$ may be each independently phenylene, naphthylene, biphenylene, fluorenylene, triphenylene, anthrylene, pyrenylene, chrysenylene or naphthacenylene; $Ar_5$ may be trivalent phenylene, naphthylene, biphenylene, fluorenylene, triphenylene, anthrylene, pyrenylene, chrycenylene or naphthacenylene; $Ar_6$ may be phenyl, naphthyl, biphenyl, fluorenyl, triphenyl, anthryl, pyrenyl, chrysenyl or naphthacenyl; R may be hydrogen, methyl, ethyl, propyl, butyl, pentyl, hexyl, heptyl, octyl, cyclopropyl, cyclobutyl, cyclopentyl, cyclohexyl, cycloheptyl, cyclooctyl, phenyl, naphthyl, biphenyl, terphenyl, fluorenyl, phenanthrenyl, anthracenyl, triphenylenyl, pyrenyl, chrysenyl, naphthacenyl, benzyl, naphthylmethyl, anthrylmethyl, pyrenylmethyl, triphenylmethyl or tolyl; w may be an integer 1 or 2; and u may be an integer of 0 or 1.

The polymer for preparing a resist underlayer film according to the present disclosure may be exemplified as polymers including a repeating unit selected from the following structures, but is not limited thereto:

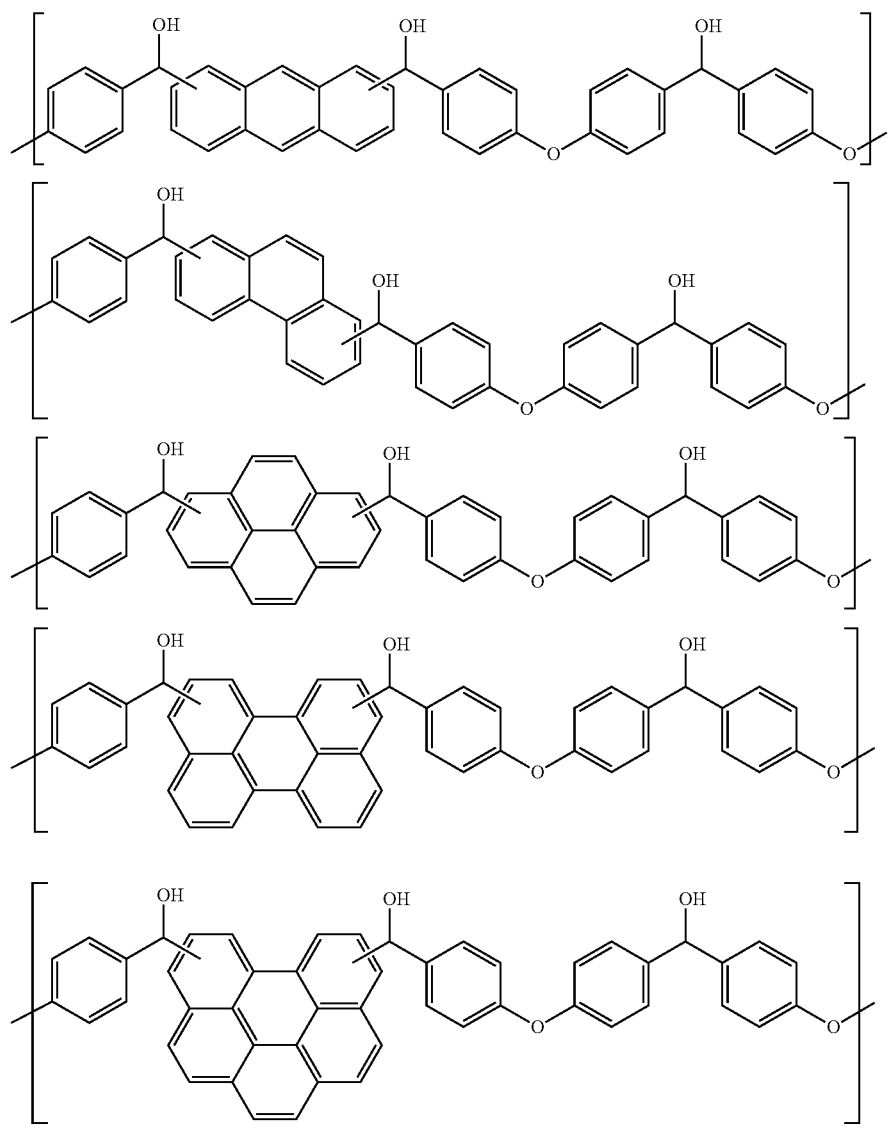

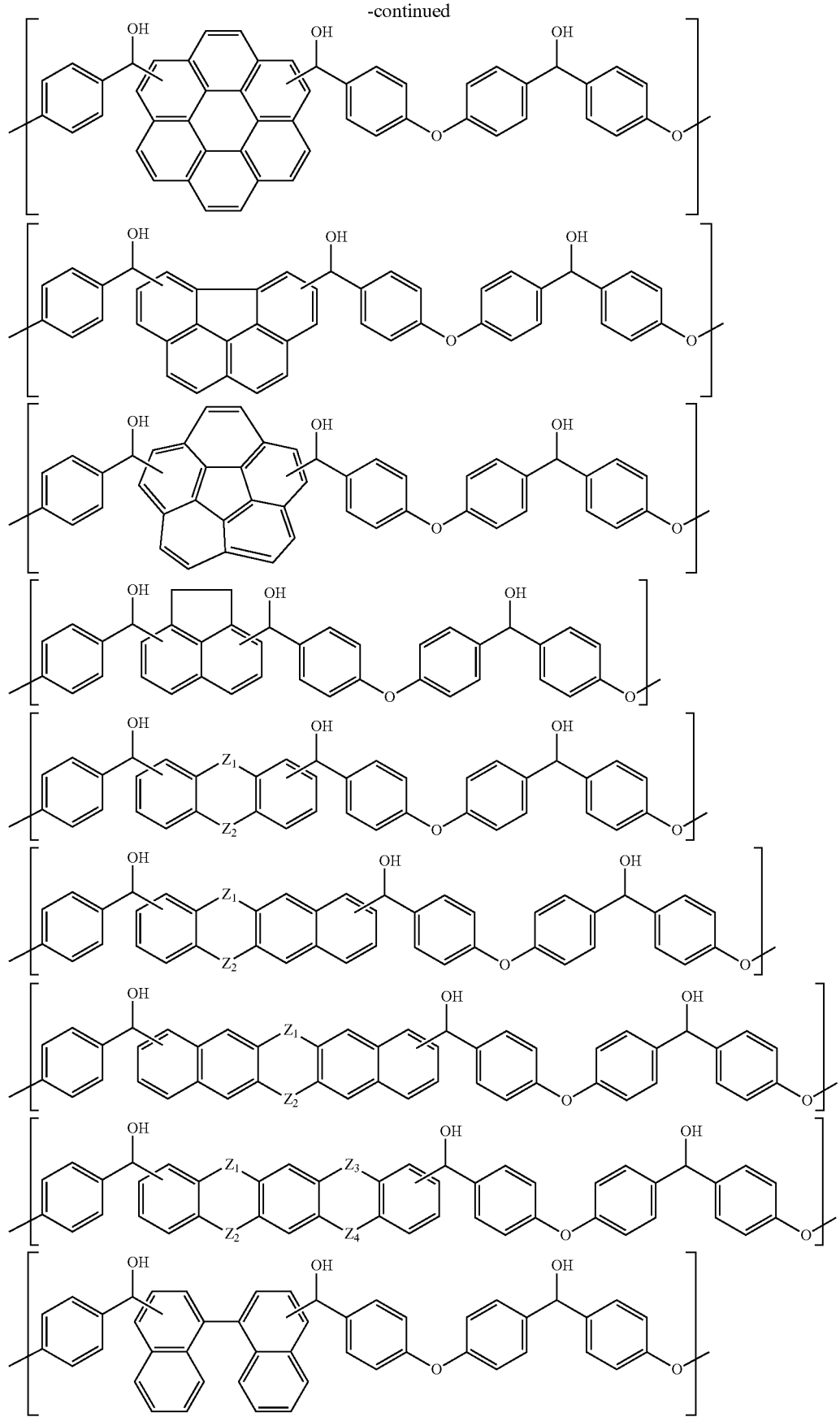

-continued
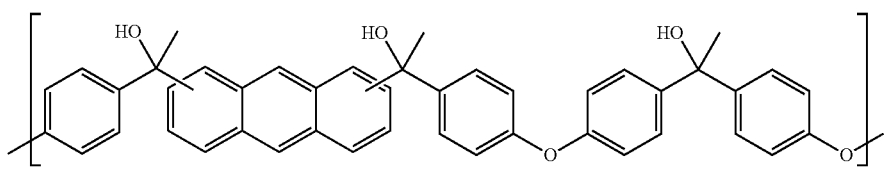
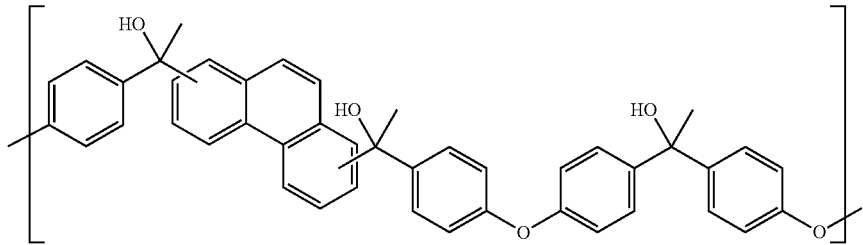
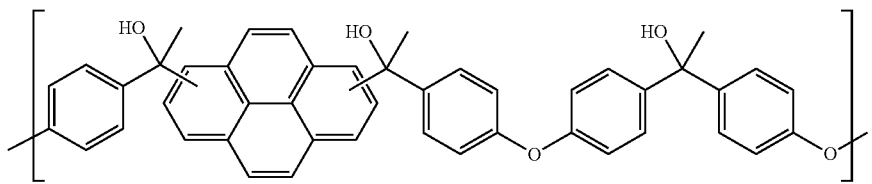
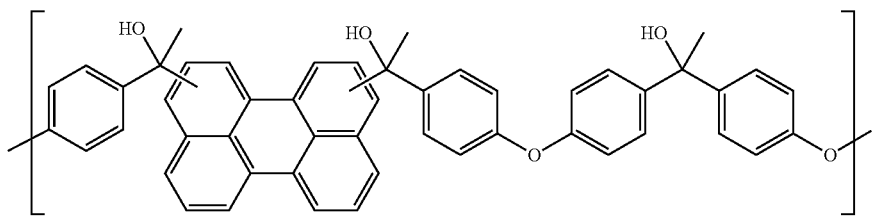
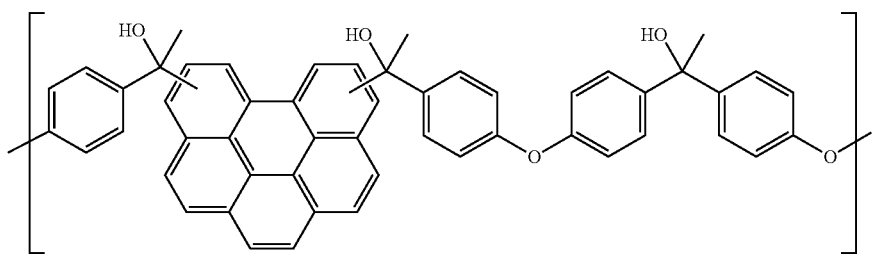
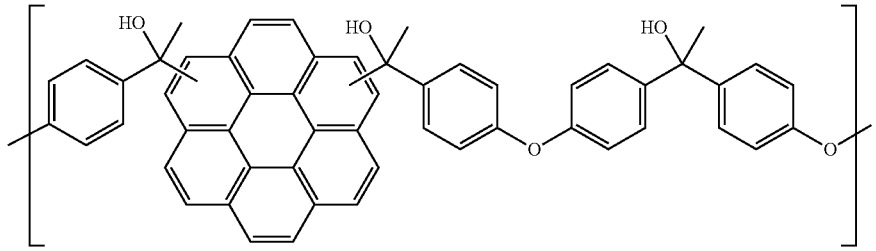
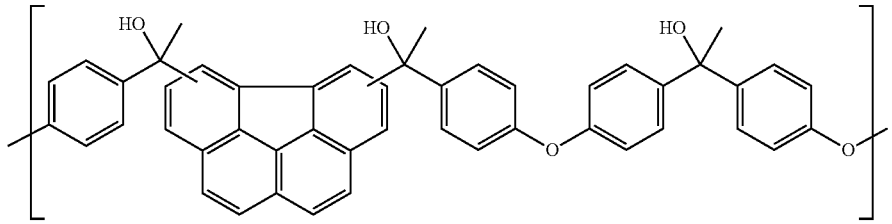

-continued
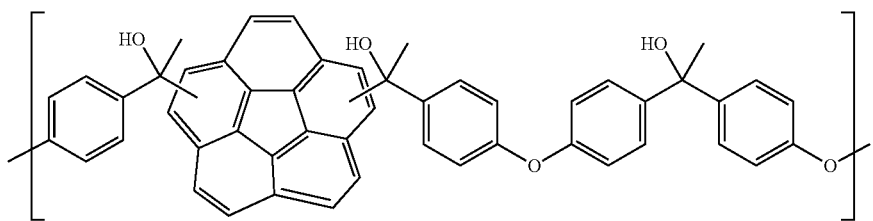
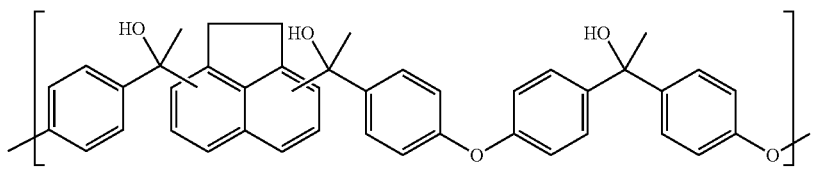
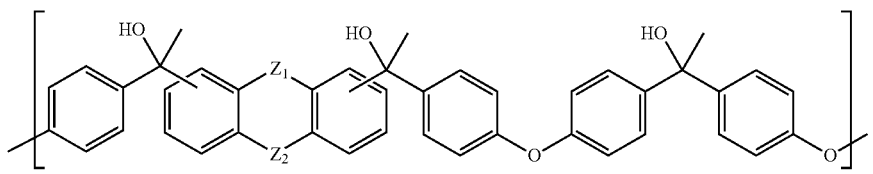
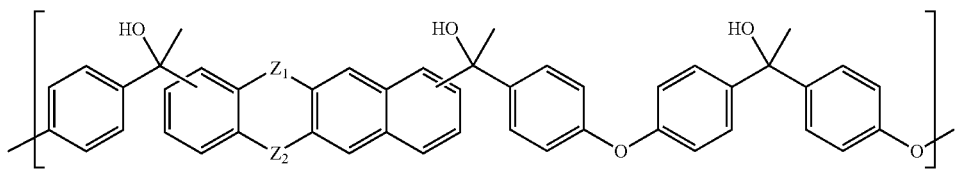
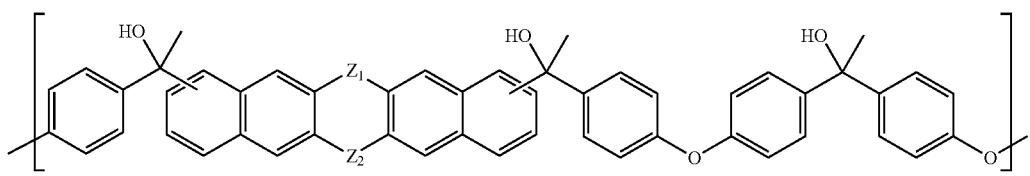
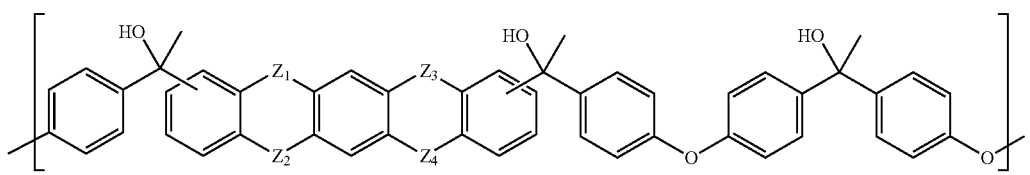
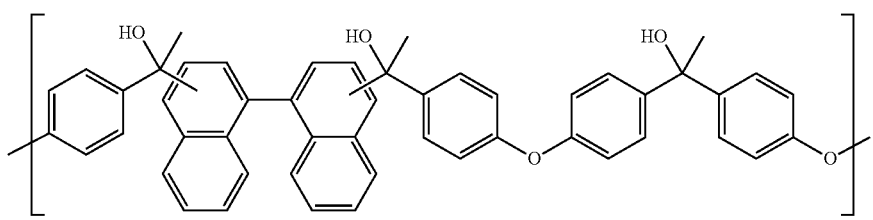
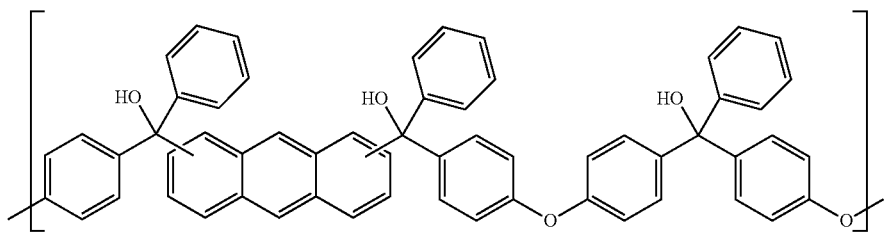

-continued
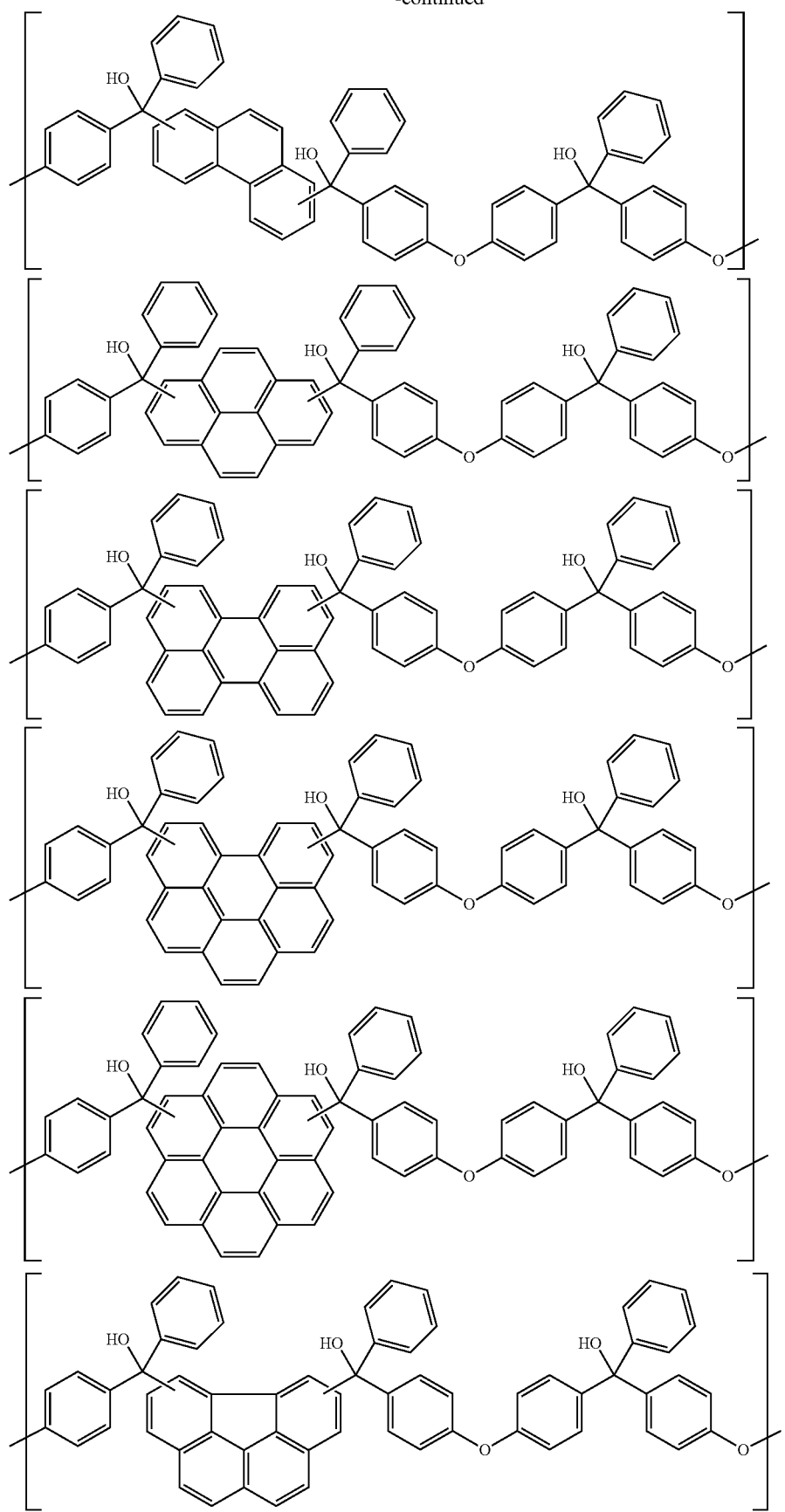

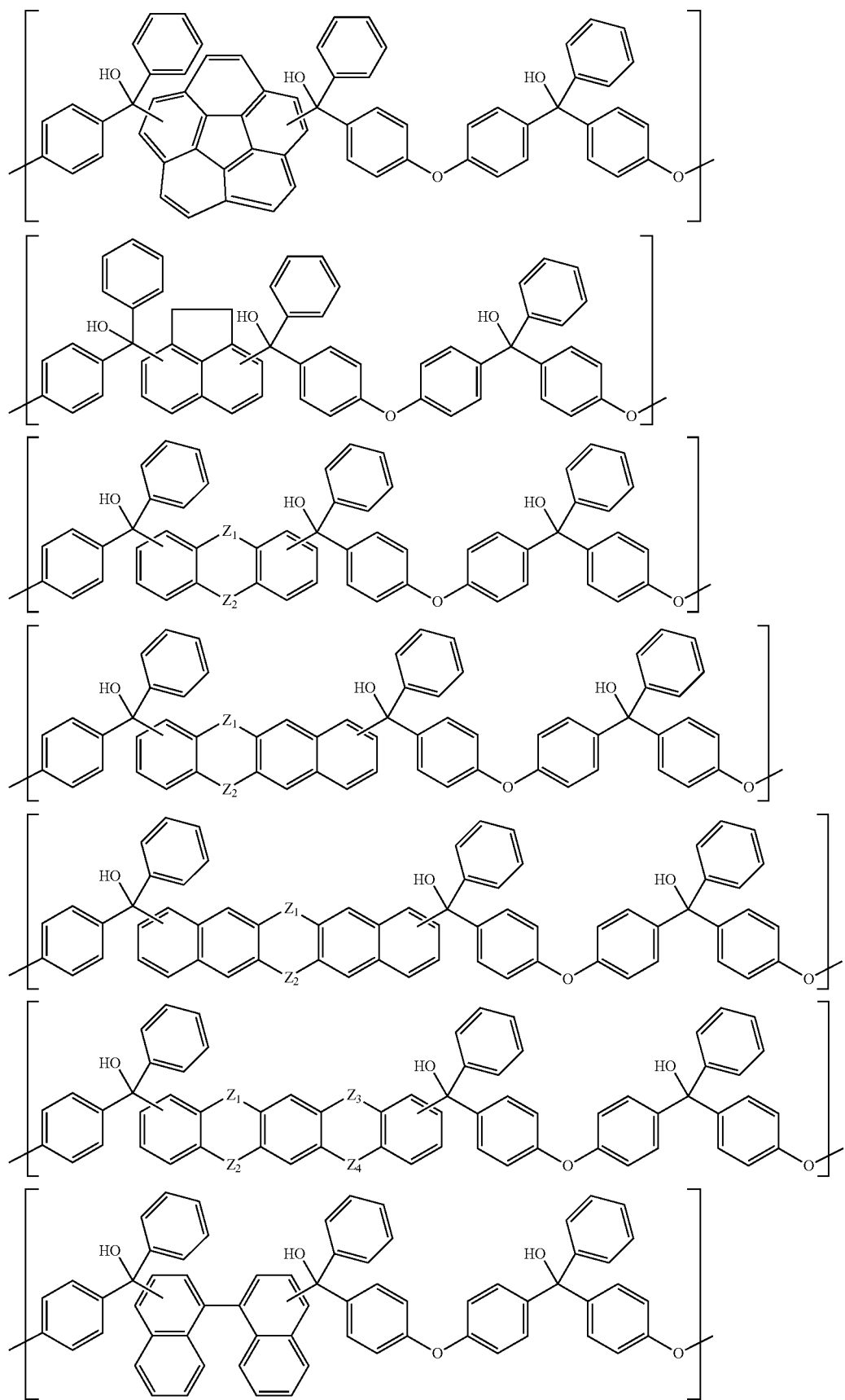

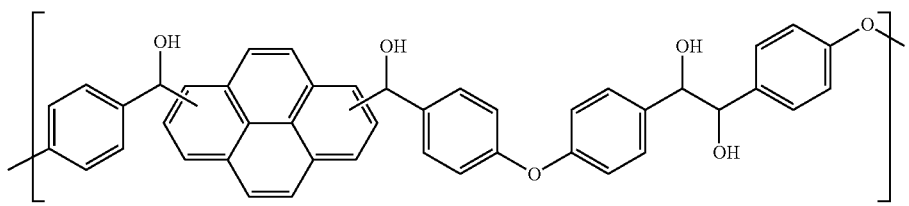
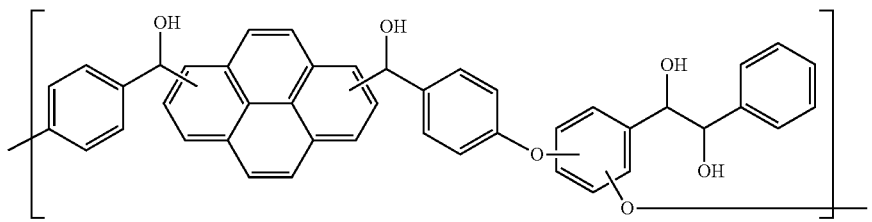
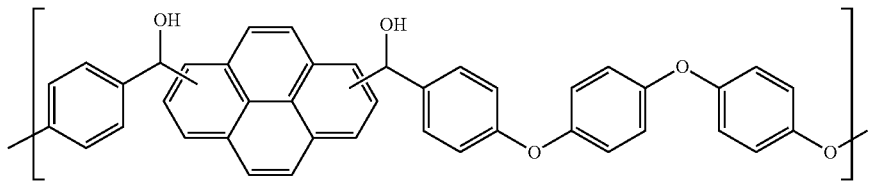
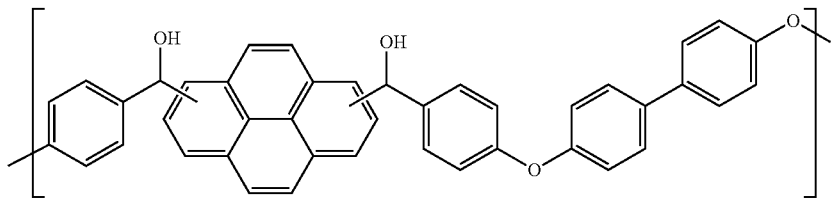
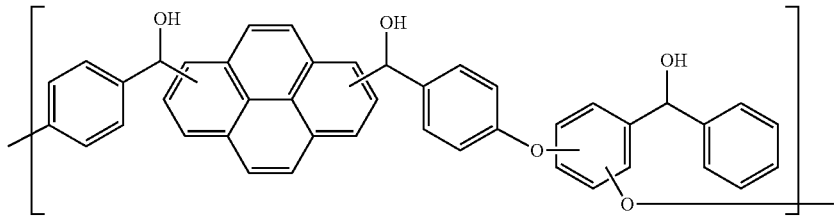
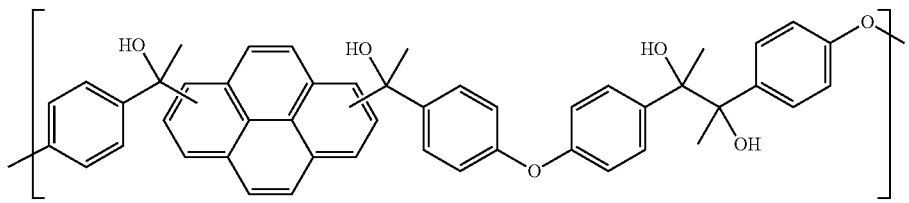
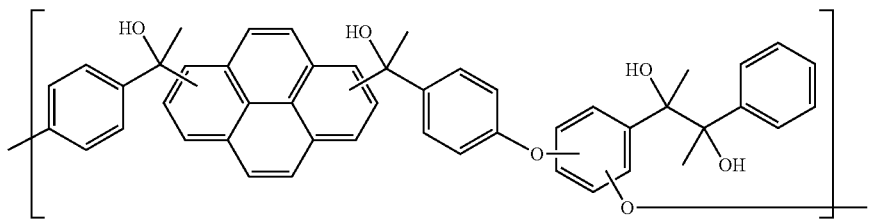
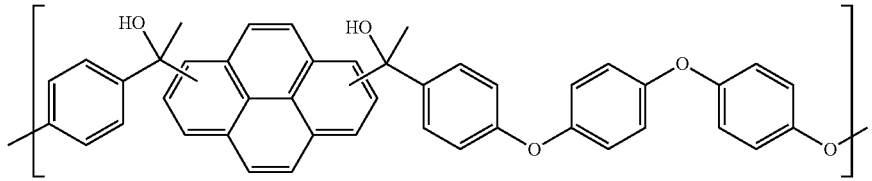

-continued
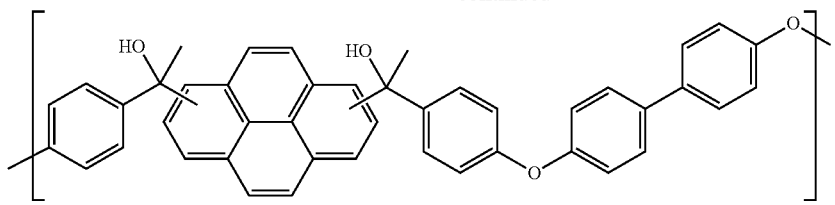
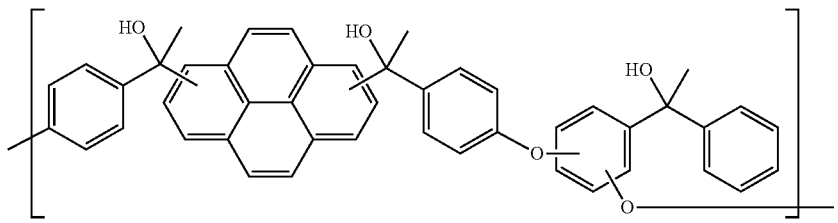
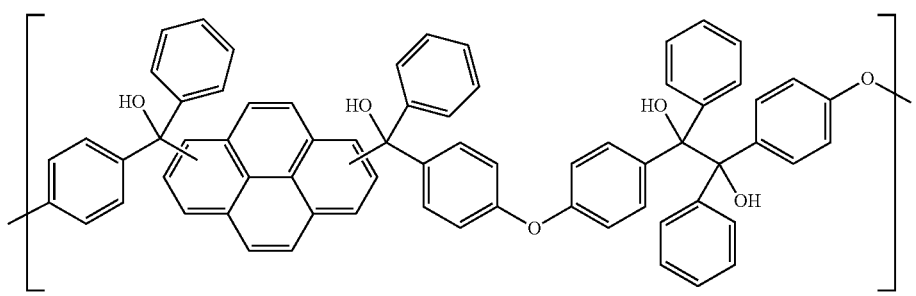
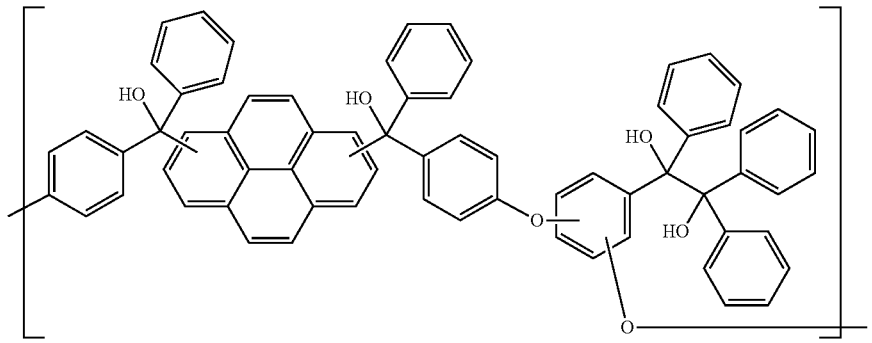
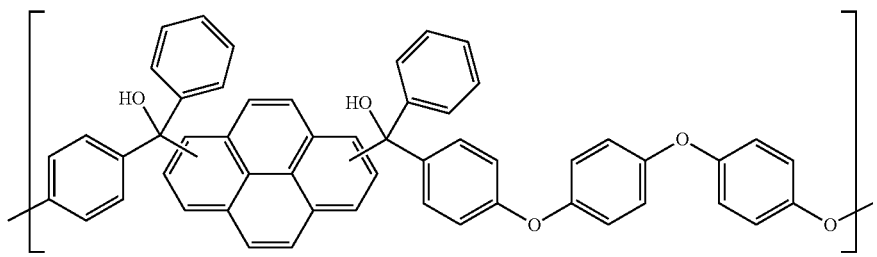
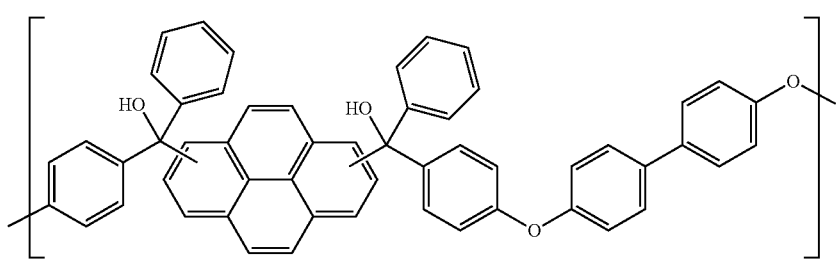

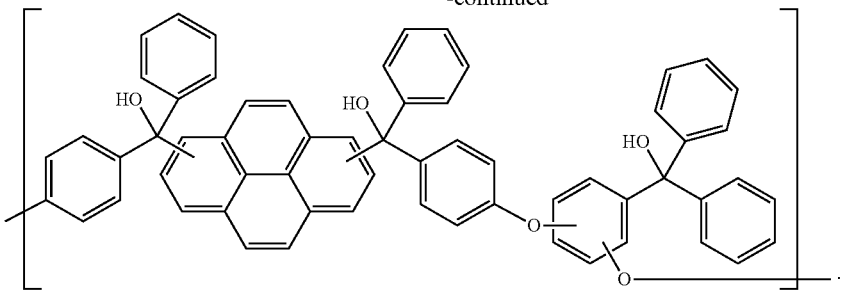

The polymer for preparing a resist underlayer film according to the present disclosure may be synthesized by known chemical reactions. The preparation process thereof may be exemplified by Reaction Schemes 1 to 3 below depending on L of Chemical Formula 1, but is not limited thereto.

When L is

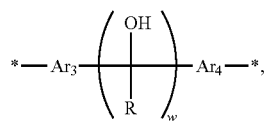

the polymer for preparing a resist underlayer film according to the present disclosure may be prepared by two stage reaction, as shown in Reaction Scheme 1 below, including: 1) preparing a polyarylketone ether polymer (P1-1) by using an arylketone derivative (S1) having two hydroxy groups and a bis(haloaryl)methanone derivative (S2-1); and 2) preparing a polymer including a repeating unit represented by Chemical Formula 1-1 or 1-2 by reducing a ketone functional group of the above prepared polyarylketone ether polymer (P1-1) to an alcohol group:

in Reaction Scheme 1, Ar, $Ar_1$, $Ar_2$, $Ar_3$, $Ar_4$ and w are the same as defined in Chemical Formula 1 above, R is (C1-C20)alkyl, (C3-C10)cycloalkyl or (C6-C20)aryl, and the alkyl, cycloalkyl, or aryl of R may be further substituted with one or more substituents selected from the group consisting of (C1-C10)alkyl, (C3-C10)cycloalkyl, and (C6-C20)aryl; and $X_1$ to $X_3$ are each independently halogen.

When L is

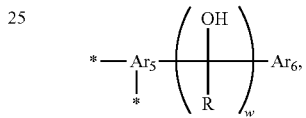

the polymer for preparing a resist underlayer film according to the present disclosure may be prepared by two stage reaction, as shown in Reaction Scheme 2 below, including: 1) preparing a polyarylketone ether polymer (P1-2) by using an arylketone derivative (S1) having two hydroxy groups and a (dihaloaryl)(aryl)methanone derivative (S2-2); and 2) preparing a polymer including a repeating unit represented by Chemical Formula 1-3 or 1-4 by reducing a ketone functional group of the above prepared polyarylketone ether polymer (P1-2) to an alcohol group:

[Reaction Scheme 1]

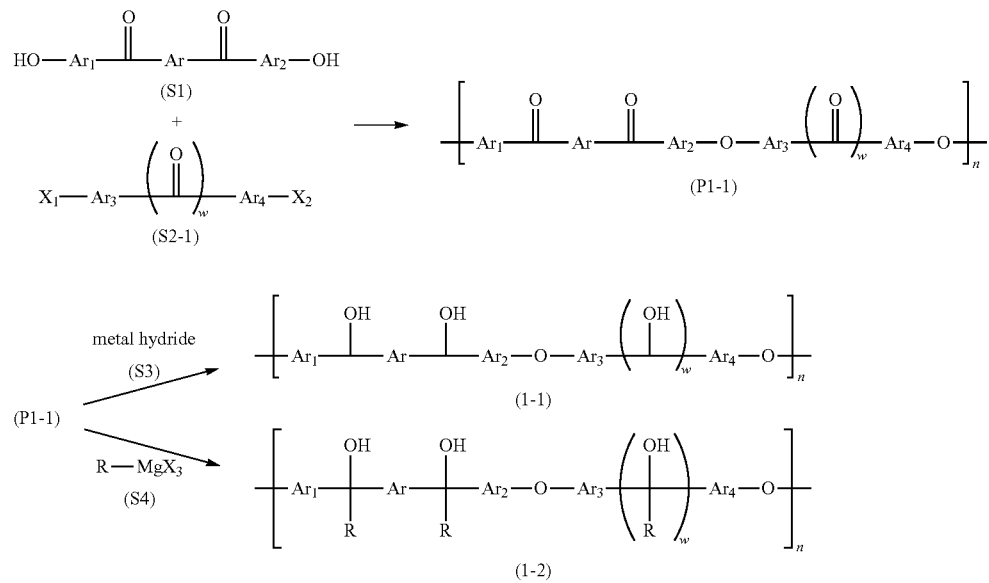

[Reaction Scheme 2]

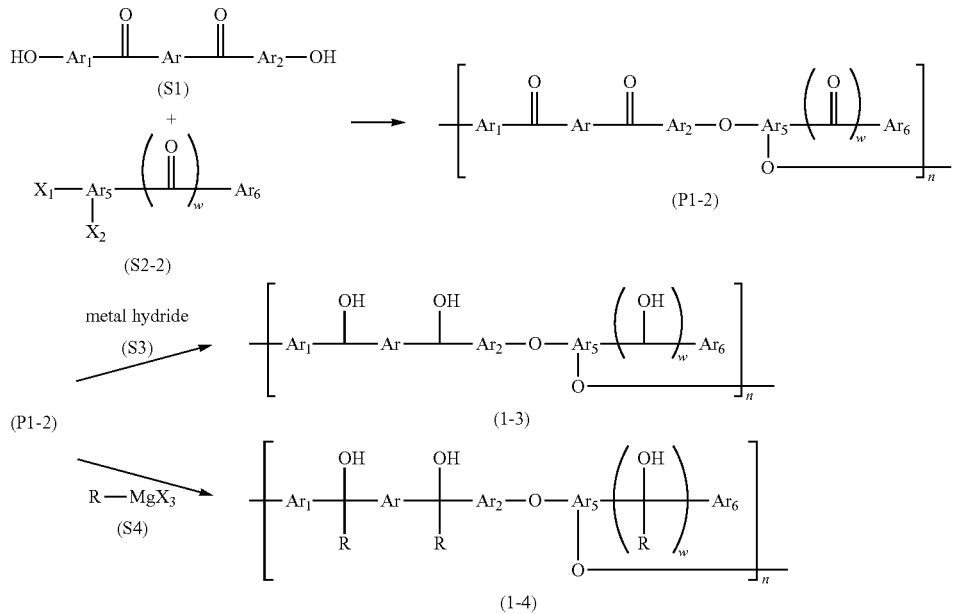

in Reaction Scheme 2, Ar, $Ar_1$, $Ar_2$, $Ar_5$, $Ar_6$ and w are the same as defined in Chemical Formula 1 above, R is (C1-C20)alkyl, (C3-C10)cycloalkyl or (C6-C20)aryl, and the alkyl, cycloalkyl, or aryl of R may be further substituted with one or more substituents selected from the group consisting of (C1-C10)alkyl, (C3-C10)cycloalkyl, and (C6-C20)aryl; and $X_1$ to $X_3$ are each independently halogen.

When L is

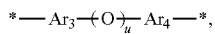

the polymer for preparing a resist underlayer film according to the present disclosure may be prepared by two stage reaction, as shown in Reaction Scheme 3 below, including: 1) preparing a polyarylketone ether polymer (P1-3) by using the arylketone derivative (S1) having two hydroxy groups and a dihaloaryl derivative (S2-3); and 2) preparing a polymer including a repeating unit represented by Chemical Formula 1-5 or 1-6 by reducing a ketone functional group of the above prepared polyarylketone ether polymer (P1-3) to an alcohol group:

[Reaction Scheme 3]

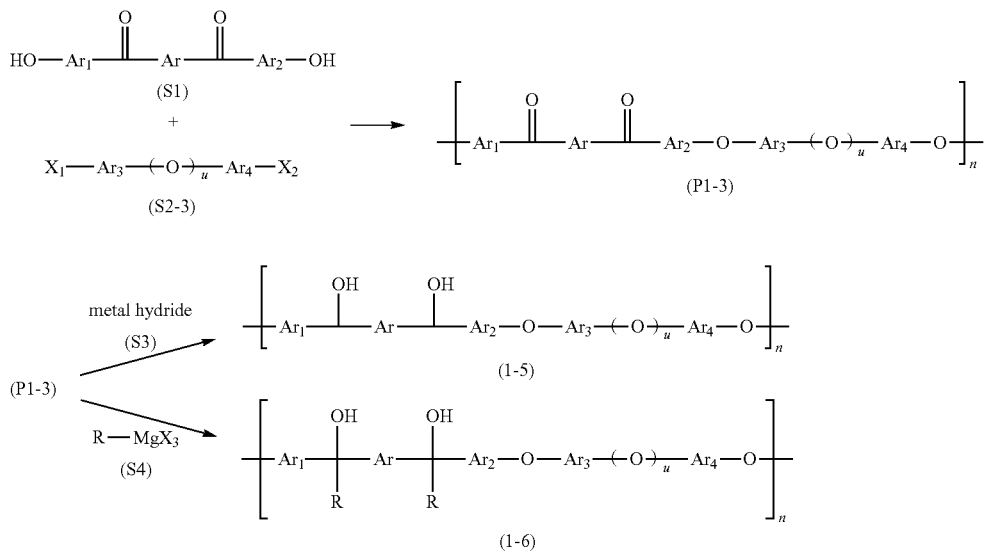

in Reaction Scheme 3, Ar, $Ar_1$, $Ar_2$, $Ar_3$, $Ar_4$ and u are the same as defined in Chemical Formula 1 above, R is (C1-C20)alkyl, (C3-C10)cycloalkyl or (C6-C20)aryl, and the alkyl, cycloalkyl, or aryl of R may be further substituted with one or more substituents selected from the group consisting of (C1-C10)alkyl, (C3-C10)cycloalkyl, and (C6-C20)aryl; and $X_1$ to $X_3$ are each independently halogen.

As exemplified in Reaction Schemes 1 to 3, the polyarylketone ether polymers (P1-1, P1-2, P1-3) may be synthesized by using the arylketone derivative (S1) having two hydroxy groups, and the bis(haloaryl)methanone derivative (S2-1) or the (dihaloaryl)(aryl)methanone derivative (S2-2) or dihaloaryl derivative (S2-3).

A used amount of the bis(haloaryl)methanone derivative (S2-1) or the (dihaloaryl)(aryl)methanone derivative (S2-2) or the dihaloaryl derivative (S2-3) is 0.5 to 3.5 mol, and preferably, 1 to 2.5 mol, based on 1 mol of the arylketone derivative (S1) having two hydroxy groups. When the used amount of the bis(haloaryl)methanone derivative (S2-1) or the (dihaloaryl)(aryl)methanone derivative (S2-2) or the dihaloaryl derivative (S2-3) is more than 3.5 mol, a molecular weight is rapidly increased, such that it is difficult to control the molecular weight, and when the used amount of the bis(haloaryl)methanone derivative (S2-1) or the (dihaloaryl)(aryl)methanone derivative (S2-2) is less than 0.5 mol, the molecular weight is excessively low, such that the polymer may not be obtained.

Generally used reaction catalysts may be basic compounds, for example, $K_2CO_3$, NaOH, KOH, LiOH, etc. A used amount of the basic compound catalyst is 0.1 to 10 mol, and preferably, 0.5 to 5 mol, based on 1 mol of the arylketone derivative (S1) having two hydroxy groups. When the used amount of the basic compound catalyst is more than 10 mol, there is a problem in that side reactions occur. When the used amount of the basic compound catalyst is less than 0.1 mol, a reaction progress speed may be slow, a reaction time may be largely consumed, and the polymer may not be obtained.

The polymerization reaction is performed even without using a solvent, but may be performed by conventional solvents. Any solvent may be used without specific limitation as long as they are general organic solvents that are capable of dissolving the monomer, etc., while not disturbing the reaction. For example, organic solvents such as dimethylformamide, tetrahydrofuran, dioxane, toluene, xylene, 1,2,3,4-tetrahydronaphthalene (THN), etc., may be used. A temperature for the polymerization reaction is generally 50° C. to 200° C. and a time for the polymerization reaction may be variously selected according to reaction temperature.

The ketone functional group of the polyarylketone ethers (P1-1, P1-2, P1-3) is known to generally have excellent reactivity, and the ketone functional group is reduced to an alcohol group by using a reducing agent. As the reducing agent, a metal hydride (S3) or a Grignard reagent (S4) may be used.

The reduction reaction may be performed at various temperatures from 10° C. to 80° C.

A solvent used for the reduction reaction may be conventional solvents. Here, any solvent may be used without specific limitation as long as they are general organic solvents without disturbing the reaction. For example, organic solvents such as dimethylformamide, tetrahydrofuran, dioxane, toluene, xylene, 1,2,3,4-tetrahydronaphthalene (THN), etc., may be used.

When the metal hydride (S3) is used as the reducing agent, the ketone functional group of the polyarylketone ethers (P1-1, P1-2, P1-3) may be reduced to a secondary alcohol form, thereby preparing the polymers (1-1, 1-3, 1-5) including the repeating unit represented by Chemical Formula 1. The metal hydride (S3) is aluminum hydride or boron hydride, and may be LiBH, LiAlH, NaAlH, NaBH, $NaBH_4$, $NaAlH_4$, $LiBH_4$, $LiAlH_4$, etc.

In addition, when the Grignard reagent (S4) is used as the reducing agent, the ketone functional group of the polyarylketone ethers (P1-1, P1-2, P1-3) may be reduced to an alcohol group, and at the same time, the polymers (1-2, 1-4, 1-6) including the repeating unit represented by Chemical Formula 1 into which a hydrocarbon substituent R is introduced, thereby increasing carbon content may be prepared.

After the reduction reaction is completed, the resultant material is subjected to precipitation in a non-polar solvent, hexane, and filtration, and then, vacuum dried, thereby obtaining polymers (1-1, 1-2, 1-3, 1-4, 1-5, and 1-6) including the repeating unit of Chemical Formula 1.

In addition, the present disclosure provides a resist underlayer film composition including the polymer for preparing the resist underlayer film including the repeating unit represented by Chemical Formula 1 above, wherein the underlayer film composition of the present disclosure may be used as a hard mask in a multilayer semiconductor lithography process.

The resist underlayer film composition of the present disclosure may form an underlayer film on the substrate such as a silicon wafer, etc., by spin-coating, spin on carbon methods, etc., and may include the polymer including the repeating unit represented by Chemical Formula 1, thereby having excellent etching resistance, thermal stability, coating uniformity, surface planarization, uniformity of pattern edges, and mechanical properties of patterns, which is applicable to a hard mask process or a planarization process of a wafer surface.

The resist underlayer film composition of the present disclosure includes: the polymer including the repeating unit represented by Chemical Formula 1; and an organic solvent.

In the resist underlayer film composition of the present disclosure, the polymer including the repeating unit represented by Chemical Formula 1 is the polymer for preparing a resist underlayer film including a repeating unit represented by Chemical Formula 2, 3, or 4.

In the resist underlayer film composition of the present disclosure, the polymer for preparing the resist underlayer film may have an amount of 0.5 to 50 wt %, preferably, 1 to 30 wt %, and more preferably, 2 to 20 wt %, based on total amount of the resist underlayer film composition. When the polymer for preparing the resist underlayer film is used within the above-described range, solubility of the resist underlayer film composition and coating property at the time of forming a film may be excellent. When the amount of the polymer for preparing the resist underlayer film is less than 0.5 wt %, an underlayer film having a desired thickness may not be formed, and when the amount of the polymer for preparing the resist underlayer film is more than 50 wt %, the underlayer film may not be uniformly formed.

In addition, the resist underlayer film composition of the present disclosure may further include at least one additive selected from crosslinking agents, acid catalysts, acid generators, antifoaming agents, and surfactants.

The polymer for preparing the resist underlayer film including the repeating unit represented by Chemical Formula 1 according to the present disclosure may be dissolved in the organic solvent to be coated on the wafer, and then, a crosslinking reaction may be performed at a high temperature by itself. However, the crosslinking reaction is generally performed by adding a crosslinking agent and a catalyst. The composition obtained after the polymer for preparing the resist underlayer film, the crosslinking agent, and the acid catalyst are dissolved in a solvent, is subjected to a filtration process so that particulate impurities are completely removed.

In the resist underlayer film composition of the present disclosure, the organic solvent to be usable may be any organic solvent as long as the polymer for preparing the resist underlayer film including the repeating unit represented by Chemical Formula 1, the crosslinking agent, and the acid catalyst or the acid generator are easily dissolved therein. The organic solvent is an organic solvent generally used for a manufacturing process of a semiconductor, and may include cyclohexanone, 2-heptanone, propyleneglycol monomethyl ether, propyleneglycol monomethyl acetate, propyleneglycol monomethyl ether acetate, gamma-butyrolactone, ethyl lactate, dimethylsulfoxide, dimethylacetamide, N-methylpyrrolidone, etc.

The crosslinking agent is to induce the crosslinking reaction to better cure the underlayer film. The crosslinking agent usable in the resist underlayer film composition of the present disclosure is not limited, and for example, at least one selected from compounds represented by Chemical Formulas 5 to 11 below:

[Chemical Formula 5]

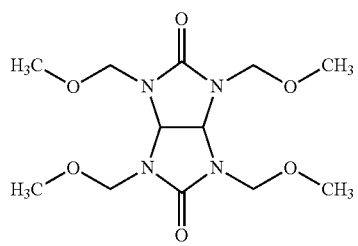

[Chemical Formula 6]

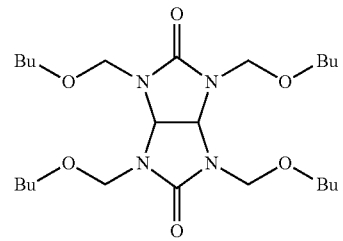

[Chemical Formula 7]

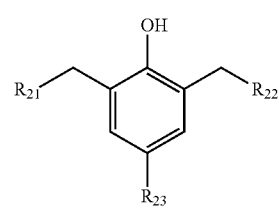

in Chemical Formula 7, $R_{21}$ and $R_{22}$ are each independently hydroxy or (C1-C3)alkoxy, and $R_{23}$ is (C1-C10)alkyl,

[Chemical Formula 8]

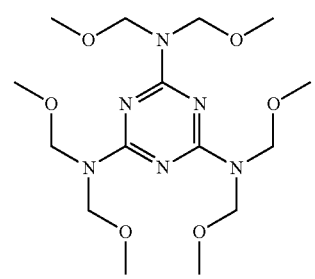

[Chemical Formula 9]

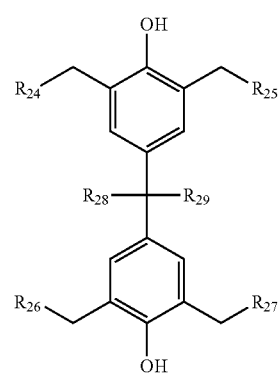

in Chemical Formula 9, $R_{24}$, $R_{25}$, $R_{26}$ and $R_{27}$ are each independently hydroxy or (C1-C3)alkoxy, and $R_{28}$ and $R_{29}$ are each independently hydrogen, (C1-C10)alkyl or halo(C1-C10)alkyl,

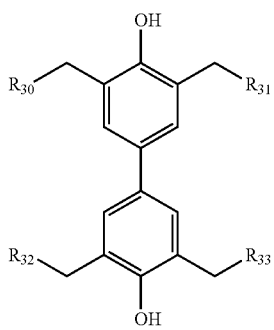
[Chemical Formula 10]
in Chemical Formula 10, $R_{30}$, $R_{31}$, $R_{32}$ and $R_{33}$ are each independently hydroxy or (C1-C3)alkoxy,
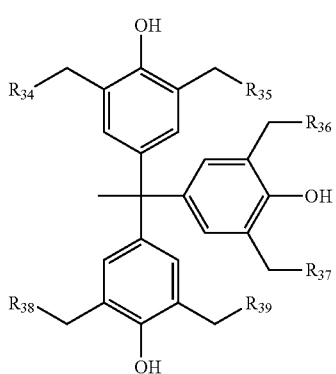
[Chemical Formula 11]
in Chemical Formula 11, $R_{34}$, $R_{35}$, $R_{36}$, $R_{37}$, $R_{38}$ and $R_{39}$ are each independently hydroxy or (C1-C3)alkoxy.
The crosslinking agent to be usable in the present disclosure may be specifically exemplified by the following structures:
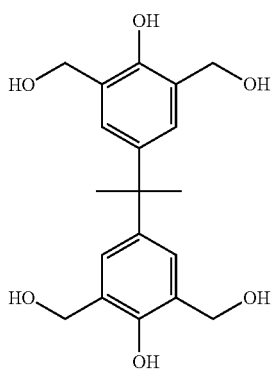
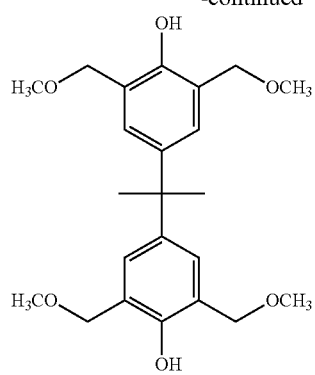
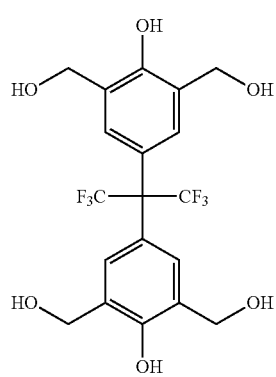
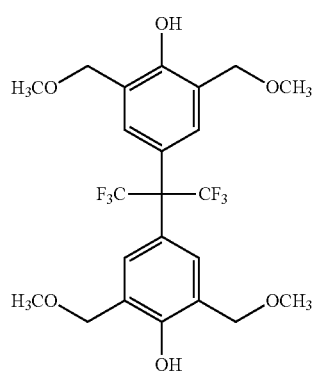
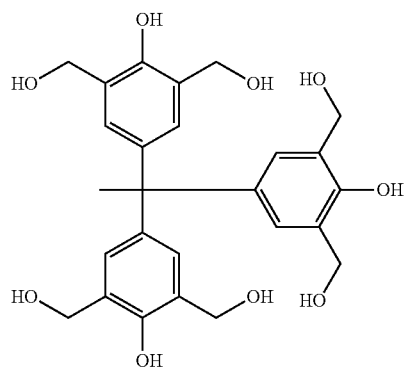

-continued

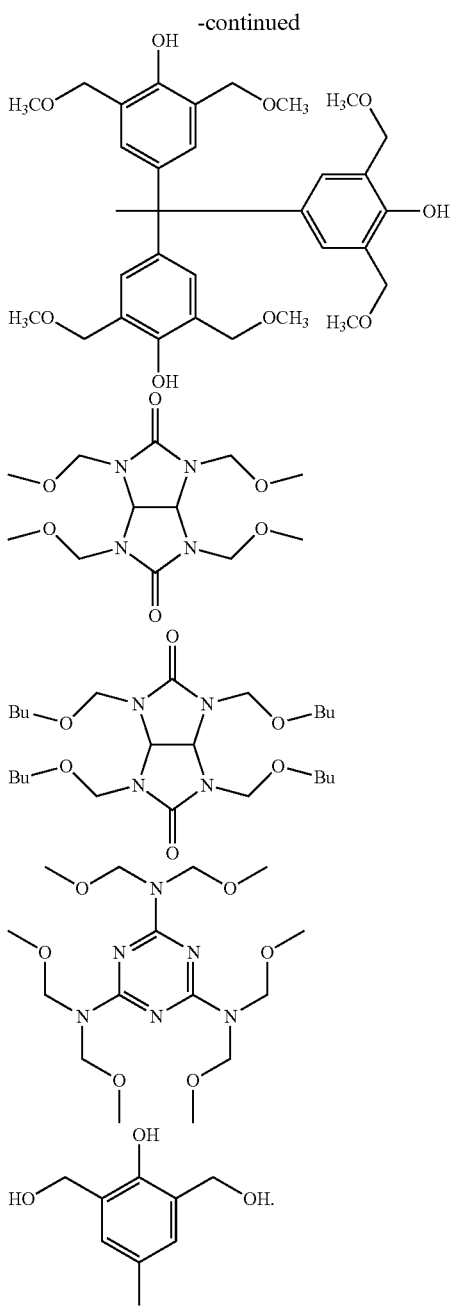

A used amount of the crosslinking agent may be slightly different depending on kinds of crosslinking agents, but the amount of the crosslinking agent may be 0.1 to 30 parts by weight, preferably, 0.1 to 20 parts by weight, and more preferably, 0.5 to 10 parts by weight, based on 100 parts by weight of the polymer for preparing the resist underlayer film including the repeating unit represented by Chemical Formula 1 of the present disclosure. When the amount of the crosslinking agent is excessively small, crosslinking is not sufficiently performed, such that the crosslinking agent is dissolved in a solvent during a process of coating organic materials at an upper part. When the amount of the crosslinking agent is excessively large, the crosslinking agent remains after the crosslinking, such that fume largely occurs, whereby stability of the resist may be decreased.

A crosslinking catalyst may be used to increase a crosslinking speed in the crosslinking process. As the crosslinking catalyst, the acid catalyst or the acid generator more advantageously functions as compared to a basic catalyst. The acid generator generates acid by pyrolysis, but may also generate acid by light irradiation.

The acid catalyst or the acid generator is added to reduce a temperature of the crosslinking reaction of the polymer and improve a crosslinking rate. The acid catalyst or the acid generator usable in the present disclosure is not limited, but for example, may be at least one selected from compounds represented by Chemical Formulas 12 to 17 below:

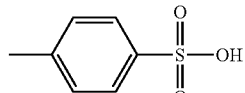

[Chemical Formula 12]

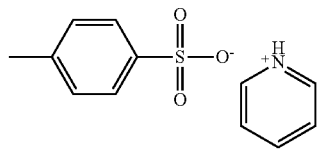

[Chemical Formula 13]

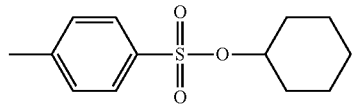

[Chemical Formula 14]

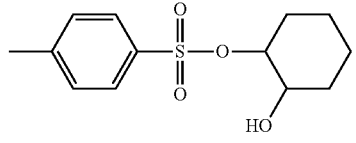

[Chemical Formula 15]

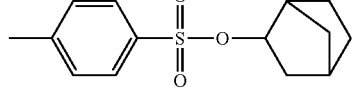

[Chemical Formula 16]

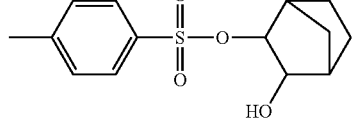

[Chemical Formula 17]

The acid catalyst may be divided into strong acids such as toluenesulfonic acid, and potential acid generators that are decomposed by heat to generate acid. In preparing the composition, it is preferred to use the potential acid generators rather than using the strong acids such as toluenesulfonic acid in view of storage stability. When the strong acids are used, storage stability of the resist underlayer film composition is decreased. A used amount of the acid catalyst or the acid generator may be 0.01 to 10 parts by weight, preferably, 0.05 to 5 parts by weight, and more preferably, 0.1 to 5 parts by weight, based on 100 parts by weight of the polymer for preparing the resist underlayer film including the repeating unit represented by Chemical Formula 1. When the amount thereof is excessively small, a curing speed is slow. On the contrary, when the amount thereof is excessively large, physical properties of a cured product may be decreased. In particular, when strength of the acid is large or great, fume largely occurs.

The surfactant may be used to improve coating uniformity at the time of forming the resist underlayer film. As the surfactant, commercially available surfactants such as sulfinol-series (Air Products and Chemicals, Inc.), F-series (F-410, F-444, F-477, R-08, R-30, etc., from DIC), etc., may be used. When the surfactant is used, the surfactant may have a content of 0.1 to 1 part by weight, preferably 0.2 to 0.8 parts by weight, based on 100 parts by weight of the total content of the resist underlayer film composition. When the content of the surfactant is more than 1 part by weight, based on 100 parts by weight of the total resist underlayer film composition, resist film quality may be poor. The resist underlayer film composition according to the present disclosure may be prepared by blending the above components according to general methods.

The resist underlayer film composition according to the present disclosure may have a film-forming property in which the film is capable of being formed by general spin-coating.

In addition, the present disclosure provides a method for forming a resist underlayer film using the resist underlayer film composition. Specifically, the method for forming the resist underlayer film may include: applying the resist underlayer film composition on a substrate; and forming a resist underlayer film by heating the substrate (wafer) to which the resist underlayer film composition is applied.

The resist underlayer film composition is applied on the substrate in a spin-coating manner, wherein a coating thickness thereof is not specifically limited, but the resist underlayer film composition may be spin-coated at a thickness of 50 to 20,000 Å on the substrate. In addition, the resist underlayer film may be formed on the substrate by heating at a heating temperature of 200 to 450° C., preferably, 300 to 400° C. for 30 seconds to 5 minutes.

After the heating process is finished, the substrate is used for a next process. In addition, the coating process, the thickness of the underlayer film, the heating temperature and time are not limited to the above-described ranges, but may vary to prepare various resist underlayer films that are different from each other depending on purposes.

The resist underlayer film composition of the present disclosure includes the polymer for preparing the resist underlayer film including the repeating unit represented by Chemical Formula 1, thereby having excellent etching resistance, thermal stability, coating uniformity, surface planarization, uniformity of pattern edges, and mechanical properties of patterns, which is applicable to a hard mask process or a planarization process of a wafer surface. Further, the resist underlayer film composition of the present disclosure has high solubility to organic solvents even though the polymer for preparing the resist underlayer film having the repeating unit represented by Chemical Formula 1 has high carbon content, thereby achieving remarkably improved storage stability and line compatibility in a semiconductor process.

Further, the present disclosure provides a method for manufacturing semiconductor device using the resist underlayer film composition. Specifically, the method for manufacturing semiconductor device includes: 1) forming a resist underlayer film by applying and heating the resist underlayer film composition as described above on a substrate; 2) forming a photoresist film on the resist underlayer film of step 1); 3) forming photoresist patterns by exposing and developing the substrate to which the resist underlayer film and the photoresist film of step 2) are applied; 4) etching the resist underlayer film by using the photoresist patterns of step 3) as an etching mask to thereby expose the substrate in a form of the patterns; and 5) etching an exposed part of the substrate.

The substrate may be conventionally usable substrates, for example, a silicon wafer, a glass substrate or a polymer substrate.

Before step 2) above, a conventional silicon-containing resist underlayer film (inorganic underlayer film) or a bottom anti-refractive coating (BARC) film may be further formed on the resist underlayer film of step 1). The silicon-containing resist underlayer film (inorganic underlayer film) may be made of, for example, silicon nitride, silicon oxide or silicon oxynitride (SiON). In addition, the method for forming patterns of the present disclosure may further include forming a bottom anti-refractive coating (BARC) film on the silicon-containing resist underlayer film.

In the forming of the photoresist patterns of step 3), heating may be performed before and/or after the exposing, respectively. The exposing may be performed by using at least one selected from the group consisting of far-ultraviolet rays (DUV; deep ultra violet) including ArF, KrF, and EUV, electron beam, X-ray, and ion beam. The forming of the photoresist patterns of step 3) may be performed by development using general alkaline aqueous solutions such as a tetramethylammonium hydroxide (TMAH) developer, etc., and the removing of the underlayer film of step 4) may be performed by dry-etching using $CHF_3/CF_4$ mixed gas, etc., and the etching of the substrate of step 5) may be performed by plasma etching using $Cl_2$ or HBr gas. Here, the etching method, etc., are not limited to the above-described methods, but may be variously changed according to process conditions.

The resist underlayer film formed by the present disclosure is formed by the polymer for preparing the resist underlayer film including the repeating unit represented by Chemical Formula 1 having excellent thermal stability, etching resistance, and coating uniformity, which has excellent thermal stability, etching resistance, and coating uniformity. Further, the resist underlayer film formed by the present disclosure has excellent solubility to organic solvents even though the polymer has high carbon content, thereby remarkably improving storage stability and line compatibility in a semiconductor process.

Hereinafter, the present disclosure is described through specific Examples and Comparative Examples in more detail. The following Examples are provided for merely exemplifying the present disclosure, and therefore, the scope of the present disclosure is not limited to the following Examples.

[Example 1] Preparation of Polymer (I)

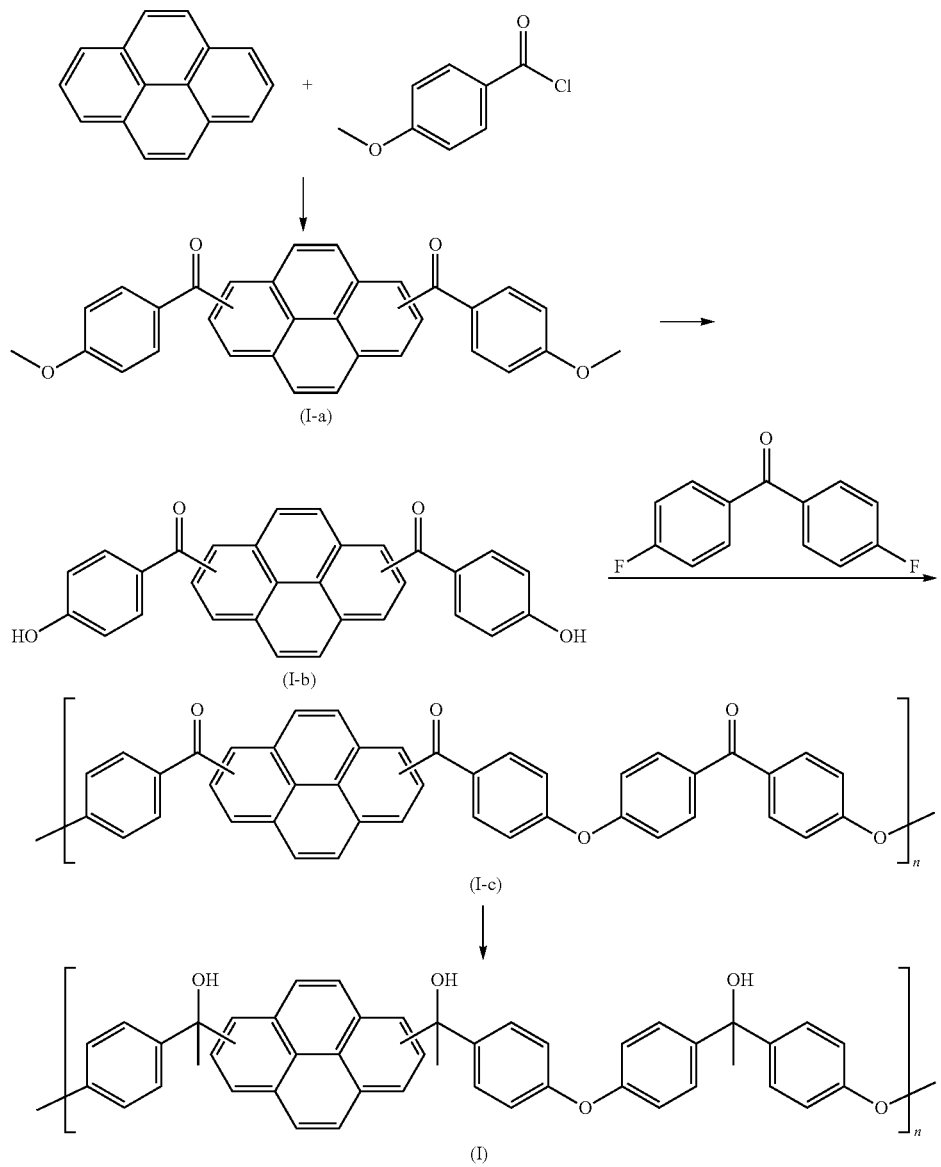

Preparation of Compound (I-a)

Aluminum chloride (8.2 g), pyrene (5 g), and dichloroethane (50 mL) were put into a flask under nitrogen atmosphere. The reaction mixture was cooled to 0° C., and then, 4-methoxybenzoyl chloride (8.4 g) was dissolved in dichloroethane (10 mL) and slowly added thereto. After the addition, the mixture was stirred at room temperature for 6 hours. After the reaction was completed, the reaction mixture was slowly added to distilled water (50 mL) cooled to 0° C., and stirred. 1.0 M sodium hydroxide aqueous solution (50 mL) was additionally added to the reaction mixture, and stirred for 30 minutes to induce layer separation. The separated organic layer was washed twice with ammonium chloride saturated aqueous solution (100 mL), and a solvent was removed by distillation under reduced pressure. The obtained solid was purified by silica chromatography, and dried to obtain a light yellow solid compound (I-a) (4.8 g).

Preparation of Compound (I-b)

The compound (I-a) (4.8 g), 1-dodecane thiol (7.8 g), and potassium hydroxide (2.1 g) were put into a flask, and dissolved in DMF (50 mL). The resultant mixture was stirred at 120° C. for 6 hours. After the reaction was completed, the reaction mixture was cooled to 0° C., and 1.0M hydrochloric acid aqueous solution (50 mL) was slowly added thereto. Ethyl acetate (50 mL) was further added thereto, thereby performing extraction twice as an organic layer. After the layer separation, the organic layer was washed twice with sodium chloride saturated aqueous solution (50 mL), and a solvent was removed by distillation under reduced pressure, thereby obtaining a light yellow solid compound (I-b) (3 g).

Preparation of Polymer (I-c)

The compound (I-b) (23.7 g), 4,4-difluorobenzophenone (4.8 g), and potassium carbonate (9.0 g) were dissolved in dimethyl formamide (300 mL) in a flask, and stirred at 150° C. for 6 hours. After the reaction was completed, the reaction mixture was cooled to room temperature. The cooled reaction mixture was slowly added to an excess amount of 1% hydrochloric acid aqueous solution, thereby precipitating the produced polymer. The precipitated polymer was filtered and washed with an excess amount of deionized water, followed by filtration to obtain a solid component. The solid component was dried in a vacuum oven at 90° C. for 24 hours or more to obtain a polymer (I-c) (20 g). As a GPC analysis result, the dried polymer (I-c) had a polystyrene-conversion weight average molecular weight of 2,700.

Preparation of Polymer (I)

The obtained polymer (I-c) (20 g) and tetrahydrofuran (100 g) were put into the flask, stirred, and cooled to 0° C. 1.0 M methylmagnesium bromide tetrahydrofuran solution (46 mL) was added to the reaction solution, and stirred at room temperature for 12 hours. After the reaction was completed, the resultant material was cooled to 0° C., and ammonium chloride saturated aqueous solution (100 mL) and ethyl acetate (50 mL) were added thereto, thereby extracting the polymer as an organic layer. After the layer separation, the thus-obtained organic layer was washed with ammonium chloride saturated aqueous solution (100 mL) once and with sodium chloride saturated aqueous solution (100 mL) once. Then, a solvent in an amount of about 800 mL was removed by distillation under reduced pressure. The remaining organic layer was put into hexane (200 mL) cooled to 0° C. to obtain a polymer. The polymer was precipitated. The precipitated polymer was filtered and washed with an excess amount of deionized water, followed by filtration to obtain a solid component. The solid component was dried in a vacuum oven at 90° C. for 24 hours or more to obtain a polymer (I) (15 g). As a GPC analysis result, the dried polymer (I) had a polystyrene-conversion weight average molecular weight of 2,900.

Example 2 and Comparative Example 1

According to compositions described in Table 1 below, the polymer, the crosslinking agent, and the acid catalyst were dissolved in the solvent (50 g), and filtered with a 0.05 μm filter to prepare a resist underlayer film composition of which particulate impurities were completely removed.

The polymers I and I-c were used. As the crosslinking agent, 1,3,4,6-tetrakis(methoxymethyl)glycoluril of Chemical Formula 5 was used, and pyridinium p-toluenesulfonate of Chemical Formula 13 was used as the acid catalyst. Propylene glycol monomethyl ether acetate (PGMEA) was used as the solvent.

TABLE 1

| | Polymer | Crosslinking Agent | Catalyst |
|---|---|---|---|
| Example 2 | I (5 g) | Chemical Formula 5 (0.5 g) | Chemical Formula 13 (0.05 g) |
| Comparative Example 1 | I-c (5 g) | Chemical Formula 5 (0.5 g) | Chemical Formula 13 (0.05 g) |

[Experimental Example 1] Formation and Evaluation of Resist Underlayer Film

The underlayer film compositions of Example 2 and Comparative Example 1 were applied on each silicon wafer by spin-coating, followed by heating at 400° C. for 120 seconds, thereby forming a resist underlayer film having a thickness of 2800 Å.

Each surface of the resist underlayer film formed on the silicon wafer was observed by the naked eye or by using scanning electron microscope (SEM), etc. Crosslinking degree, surface uniformity, whether crack occurs, pattern roughness, and whether fume occurs (400° C.) were evaluated through the surface observation. Results thereof were shown in Table 2 below, wherein ⊚ means significantly excellent, ○ means excellent, Δ means medium, and x means poor. In addition, solubility was evaluated by dissolving each polymer at an amount of 20 wt % in PMA (propylene glycol methyl ether acetate), PM (propylene glycol methyl ether), EEP (ethyl 3-ethoxypropionate) or PMA/PM (volume ratio of 3/7) mixed solvent, respectively, and observing transparency of each solution. Results thereof were shown in Table 2 below, wherein ⊚ means significantly excellent, ○ means excellent, Δ means medium, and x means poor.

TABLE 2

| Resist underlayer film composition | Cross linking degree | Surface uniformity | Whether crack occurs | Etching resistance | Solubility |
|---|---|---|---|---|---|
| Example 2 | ⊚ | ⊚ | None | ⊚ | ⊚ |
| Comparative Example 1 | Δ | Δ | None | Δ | Δ |

Evaluation 1: Crosslinking Degree

In order to confirm a crosslinking ability of the formed resist underlayer film, after the heating process was performed, a thickness of the underlayer film was measured. Then, the wafer on which the underlayer film was formed was immersed in an ethyl lactate solution for 1 minute, and washed with distilled water to completely remove ethyl lactate, followed by baking on a hot plate at 100° C. for 10 seconds, and a thickness of the underlayer film was measured again.

Evaluation 2: Gap-Fill Characteristic and Planarization Characteristic

The underlayer film compositions of Example 2 and Comparative Example 1 were applied on silicon wafers each having etched patterns by spin-coating, followed by thermal treatment at 400° C. for 120 seconds, thereby forming underlayer films. Then, gap-fill characteristic and planarization characteristic were observed by using a field emission scanning electron microscope (FE-SEM). Results thereof were shown in Table 3 below. The gap-fill characteristic was evaluated by observing a cross section of the patterns by using FE-SEM, and confirming whether void occurs. The planarization characteristic was evaluated by measuring a thickness of the underlayer film from an image of the cross section of the patterns observed by using FE-SEM and calculating according to Calculation Formula 1, as shown in FIG. 1. Since the planarization characteristic is excellent when a difference between h1 and h2 is not large, the planarization characteristic is more excellent as the numerical value becomes smaller.

TABLE 3

| Resist underlayer film composition | Planarization characteristic | Gap-fill characteristic |
| --- | --- | --- |
| Example 2 | 10.5 | Void free |
| Comparative Example 1 | 15.1 | Void occurs |

Evaluation 3: Thermal Stability

The resist underlayer film compositions of Example 2 and Comparative Example 1 were applied on each silicon wafer by spin-on coating, followed by thermal treatment on a hot plate at 240° C. for 1 minute, thereby forming each thin film. A thickness of the formed thin film was measured by a thin film thickness measurement system (K-MAC Co., Ltd). Next, the thin film was subjected to thermal treatment at 400° C. for 2 minutes again, and then, a thickness of the thin film was measured. A reduction rate of each thin film thickness was shown in Table 4 below.

TABLE 4

| Resist underlayer film composition | Reduction rate of thin film thickness (%) |
| --- | --- |
| Example 2 | −3.8 |
| Comparative Example 1 | −10 |

Evaluation 4: Etching Resistance

The resist underlayer film compositions of Example 2 and Comparative Example 1 were applied on each silicon wafer by spin-on coating, followed by thermal treatment (bake) at 400° C. for 2 minutes, thereby forming each underlayer film. Then, a thickness of the underlayer film was measured. Next, the underlayer film was subjected to dry-etching for 60 seconds and 100 seconds, respectively, using $N_2/O_2$ mixed gas and $CF_x$ gas, and a thickness of the underlayer film was measured again. A bulk etch rate (BER) was calculated by using the thicknesses of the underlayer film before and after dry-etching and etching time according to the following Calculation Formula 2. Results thereof were shown in Table 5 below.

Thickness of initial thin film−thickness of thin film after etching)/etching time (Å/s)    Calculation Formula 2

TABLE 5

| Resist underlayer film composition | N2/O2 bulk etch rate (Å/s) | CFx bulk etch rate (Å/s) |
| --- | --- | --- |
| Example 2 | 24.7 | 27.1 |
| Comparative Example 1 | 27.1 | 27.5 |

Evaluation 5: Storage Stability Acceleration Test

Storage stability acceleration test was performed by dissolving the polymer prepared by Example 1 having an amount of 20 wt % in various organic solvents, leaving the dissolved solutions at 50° C. for 3 weeks, and observing transparency of each solution, which is the same as the solubility test above.

The used organic solvent: E/L (Ethyl acetate), PM (Propylene Glycol Methyl Ether), C/H(Cyclohexanone), EEP (Ethyl 3-ethoxypropionate) or PMA/PM (volume ratio of 3/7) mixed solvent It was confirmed that the polymer of the present disclosure had excellent solubility to general organic solvents. In addition, as a result of storage stability acceleration test at 50° C., it was confirmed that the polymer was stable without generating precipitate even after 3 weeks, thereby achieving a sufficiently improved storage stability.

[Experimental Example 2] Formation of Patterns

The resist underlayer film composition of Example 2 was applied on a wafer by spin-on coating, followed by baking at 250° C. for 60 seconds, thereby forming an underlayer film having a thickness of 130 nm. Then, photoresist for ArF was coated on the underlayer film, followed by baking at 110° C. for 60 seconds, thereby forming a photoresist layer having a thickness of 90 nm. The photoresist layer was exposed by using an ArF excimer laser scanner (Nikon, NSR-S305B, NA=0.68, σ=0.85), and baked at 90° C. for 90 seconds. Then, the layer was subjected to development for 60 seconds with a TMAH (2.38 wt % aqueous solution) developer to obtain photoresist patterns. The underlayer film was subjected to dry-etching with $CHF_3/CF_4$ mixed gas by using the obtained photoresist patterns as an etching mask, followed by dry-etching again with $BCl_3/Cl_2$ mixed gas. Lastly, remaining organic materials were completely removed by using $O_2$ gas.

After the photolithography process and the etching process, the cross section of the patterns was observed by FE-SEM, and accordingly, it could be appreciated that hard mask layer pattern shape in a vertical shape, and pattern fidelity, CD (critical dimension) uniformity, line width roughness, etc., were excellent.

Since the novel polymer for preparing a resist underlayer film according to the present disclosure simultaneously includes at least two hydroxy groups to have excellent thermal resistance in addition to optimized etching selectivity and planarization characteristic, the resist underlayer film composition containing the polymer may form a spin on carbon (SOC) hard mask by spin-coating in a multilayer semiconductor lithography process. Further, fume may less occur in a post process heated at 400° C., such that the resist underlayer film composition containing the polymer is useful as a high-temperature SOC material.

Due to the novel polymer, the resist underlayer film composition containing the polymer of the present disclosure may have excellent etching resistance, thermal stability, and coating uniformity, and particularly, may have excellent solubility to organic solvents even though the polymer has high carbon content, thereby remarkably improving storage stability and line compatibility in a semiconductor process.

In addition, the resist underlayer film formed according to the present disclosure may have excellent thermal stability and excellent gap-fill characteristic even when being applied on the wafer having steps, thereby achieving excellent planarization. Further, the resist underlayer film formed according to the present disclosure may have excellent etching resistance to thereby serve as a protective layer (hard mask) for forming shapes of predetermined patterns at the time of a dry-etching process, to minimize a loss of the mask as the etching speed of the resist film becomes fast or slow, and to increase an etching amount of the underlayer film.

In addition, even in the case in which the resist underlayer film formed by using the resist underlayer film composition of the present disclosure is subjected to a photolithography process and an etching process, the resist underlayer film has excellent results in view of pattern fidelity, CD (critical dimension) uniformity, surface roughness, etc.

What is claimed is:

1. A polymer for preparing a resist underlayer film comprising:
a repeating unit represented by Chemical Formula 1 below:

[Chemical Formula 1]

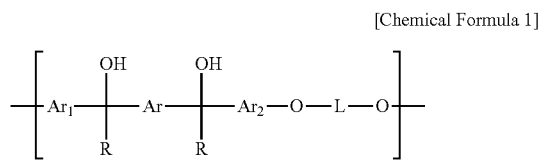

in Chemical Formula 1,
Ar is

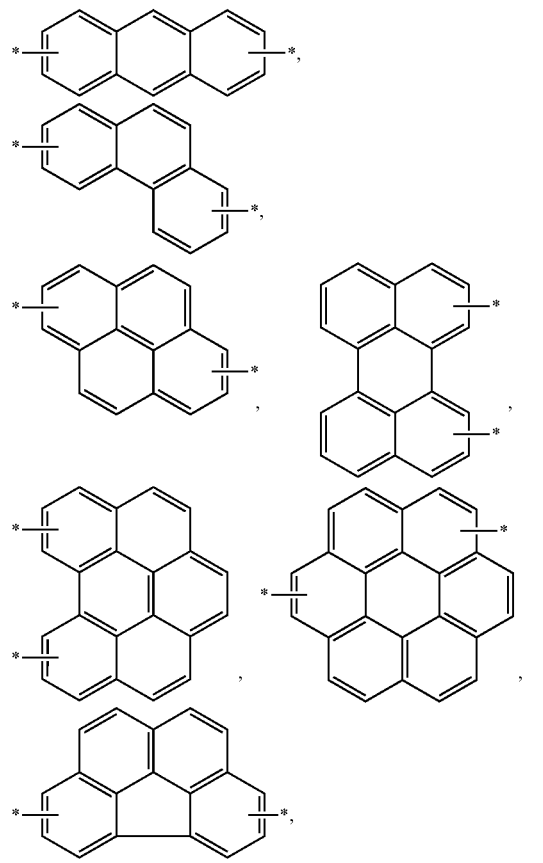

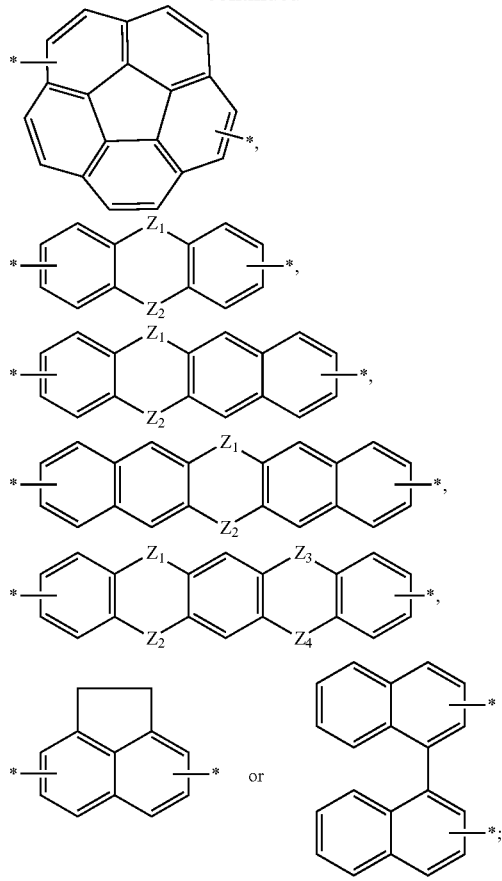

$Z_1$ to $Z_4$ are each independently C=O, $NR^a$, O, S or $CR^bR^c$; $R^a$ to $R^c$ are each independently hydrogen, (C1-C10)alkyl, halogen, (C3-C10)cycloalkyl, or (C6-C20)aryl, and the alkyl, cycloalkyl, and aryl may be further substituted with one or more substituents selected from the group consisting of halogen, (C1-C10)alkyl, halo(C1-C10)alkyl, (C3-C10)cycloalkyl, and (C6-C20)aryl;
$Ar_1$ and $Ar_2$ are each independently (C6-C30)arylene;
L is

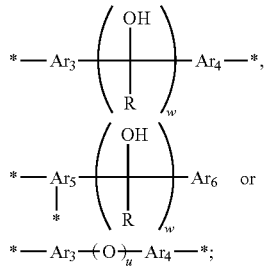

$Ar_3$ and $Ar_4$ are each independently (C6-C30)arylene;
$Ar_5$ is trivalent (C6-C30)arylene;
$Ar_6$ is (C6-C30)aryl;
the arylene of $Ar_3$, $Ar_4$ and $Ar_5$, and the aryl of $Ar_6$ may be further substituted with one or more substituents selected from the group consisting of (C1-C10)alkyl, (C3-C10)cycloalkyl, (C6-C20)aryl, (C1-C10)alkoxy, (C6-C20)aryloxy, (C1-C10)alkyl(C6-C20)aryl and (C6-C20)aryl(C1-C10)alkyl, R is hydrogen, (C1-C20)alkyl, (C3-C10)cycloalkyl or (C6-C20)aryl, and the alkyl, cycloalkyl, or aryl of R may be further substituted with one or more substituents selected from the group consisting of (C1-C10)alkyl, (C3-C10)cycloalkyl and (C6-C20)aryl;

w is an integer of 1 to 5;

u is an integer of 0 or 1; and the heteroaryl and the heterocycloalkyl include one or more heteroatoms selected from B, N, O, S, P(=O), Si, Se and P.

2. The polymer for preparing a resist underlayer film of claim 1, wherein the polymer includes a repeating unit represented by Chemical Formula 2, 3, or 4 below:

[Chemical Formula 2]

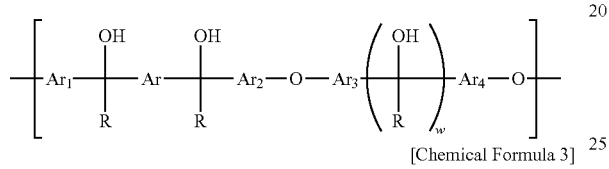

[Chemical Formula 3]

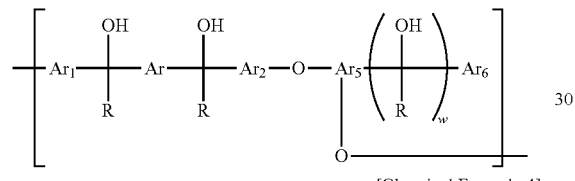

[Chemical Formula 4]

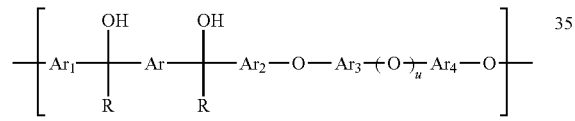

in Chemical Formula 2, 3, or 4, Ar, $Ar_1$, $Ar_2$, $Ar_3$, $Ar_4$, $Ar_5$, $Ar_6$, R, w and u are the same as defined in Chemical Formula 1 above of claim 1.

3. The polymer for preparing a resist underlayer film of claim 2, wherein $Ar_3$ and $Ar_4$ are each independently phenylene, naphthylene, biphenylene, fluorenylene, triphenylene, anthrylene, pyrenylene, chrysenylene or naphthacenylene; $Ar_5$ is trivalent phenylene, naphthylene, biphenylene, fluorenylene, triphenylene, anthrylene, pyrenylene, chrysenylene or naphthacenylene; $Ar_6$ is phenyl, naphthyl, biphenyl, fluorenyl, triphenyl, anthryl, pyrenyl, chrysenyl or naphthacenyl; R is hydrogen, methyl, ethyl, propyl, butyl, pentyl, hexyl, heptyl, octyl, cyclopropyl, cyclobutyl, cyclopentyl, cyclohexyl, cycloheptyl, cyclooctyl, phenyl, naphthyl, biphenyl, terphenyl, fluorenyl, phenanthrenyl, anthracenyl, triphenylenyl, pyrenyl, chrysenyl, naphthacenyl, benzyl, naphthylmethyl, anthrylmethyl, pyrenylmethyl, triphenylmethyl or tolyl; w is an integer 1 or 2; and u is an integer of 0 or 1.

4. The polymer for preparing a resist underlayer film of claim 1, wherein the polymer has a weight average molecular weight of 500 or more.

5. A resist underlayer film composition comprising:

a polymer for preparing a resist underlayer film including a repeating unit represented by Chemical Formula 1 below; and an organic solvent:

[Chemical Formula 1]

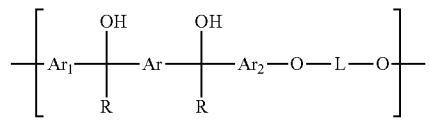

in Chemical Formula 1,

Ar is

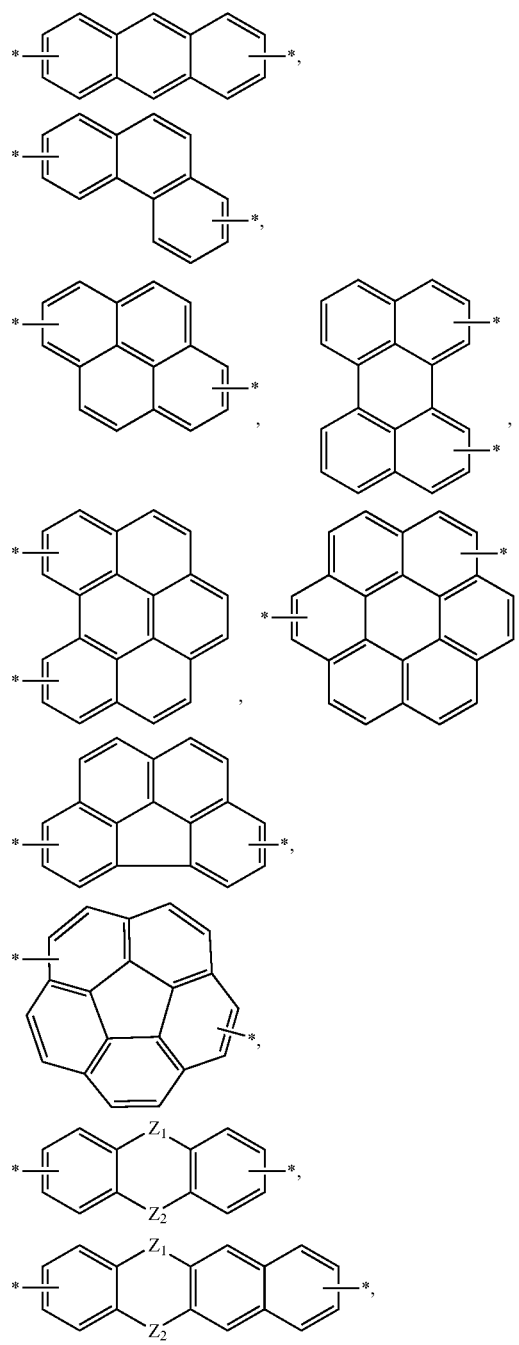

-continued

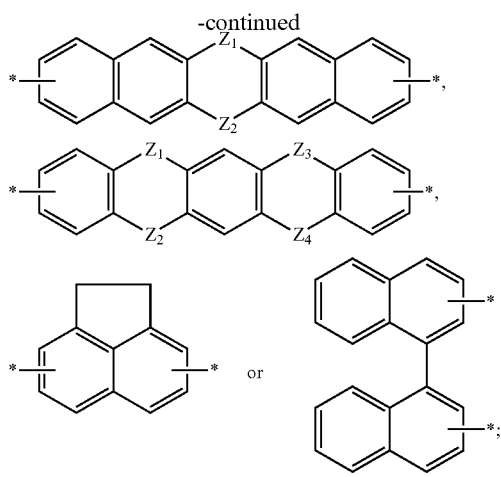

$Z_1$ to $Z_4$ are each independently C=O, $NR^a$, O, S or $CR^bR^c$; $R^a$ to $R^c$ are each independently hydrogen, (C1-C10)alkyl, halogen, (C3-C10)cycloalkyl, or (C6-C20)aryl, and the alkyl, cycloalkyl, and aryl may be further substituted with one or more substituents selected from the group consisting of halogen, (C1-C10)alkyl, halo(C1-C10)alkyl, (C3-C10)cycloalkyl, and (C6-C20)aryl;

$Ar_1$ and $Ar_2$ are each independently (C6-C30)arylene;

L is

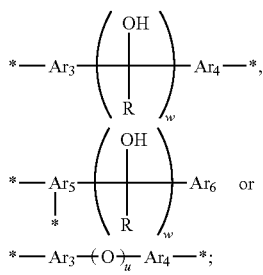

$Ar_3$ and $Ar_4$ are each independently (C6-C30)arylene;
$Ar_5$ is trivalent (C6-C30)arylene;
$Ar_6$ is (C6-C30)aryl;
the arylene of $Ar_3$, $Ar_4$ and $Ar_5$, and the aryl of $Ar_6$ may be further substituted with one or more substituents selected from the group consisting of (C1-C10)alkyl, (C3-C10)cycloalkyl, (C6-C20)aryl, (C1-C10)alkoxy, (C6-C20)aryloxy, (C1-C10)alkyl(C6-C20)aryl and (C6-C20)aryl(C1-C10)alkyl, R is hydrogen, (C1-C20)alkyl, (C3-C10)cycloalkyl or (C6-C20)aryl, and the alkyl, cycloalkyl, or aryl of R may be further substituted with one or more substituents selected from the group consisting of (C1-C10)alkyl, (C3-C10)cycloalkyl and (C6-C20)aryl;

w is an integer of 1 to 5;
u is an integer of 0 or 1; and
the heteroaryl and the heterocycloalkyl include one or more heteroatoms selected from B, N, O, S, P(=O), Si, Se and P.

6. The resist underlayer film composition of claim 5, wherein the polymer for preparing a resist underlayer film includes a repeating unit represented by Chemical Formula 2, 3 or 4 below:

[Chemical Formula 2]

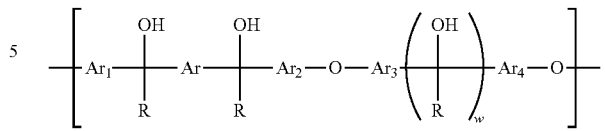

[Chemical Formula 3]

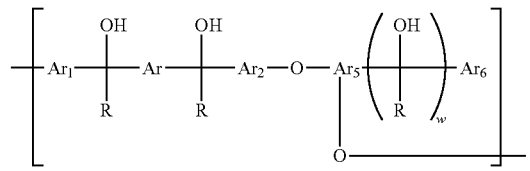

[Chemical Formula 4]

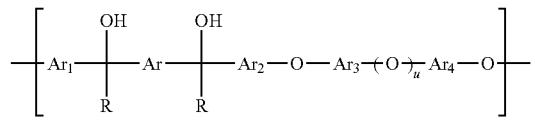

in Chemical Formula 2, 3, or 4, Ar, $Ar_1$, $Ar_2$, $Ar_3$, $Ar_4$, $Ar_5$, $Ar_6$, R, w and u are the same as defined in Chemical Formula 1 above of claim 5.

7. The resist underlayer film composition of claim 5, wherein the polymer for preparing a resist underlayer film including the repeating unit represented by Chemical Formula 1 has an amount of 0.5 to 50 wt % and the organic solvent has an amount of 50 to 99.5 wt %, based on total amount of the resist underlayer film composition.

8. The resist underlayer film composition of claim 5, wherein the organic solvent is at least one selected from cyclohexanone, 2-heptanone, propyleneglycol monomethyl ether, propyleneglycol monomethyl acetate, propyleneglycol monomethyl ether acetate, gamma-butyrolactone, ethyl lactate, dimethyl sulfoxide, dimethyl acetamide, and N-methyl pyrrolidone.

9. The resist underlayer film composition of claim 5, further comprising at least one additive selected from cross-linking agents, acid catalysts, acid generators, antifoaming agents, and surfactants.

10. The resist underlayer film composition of claim 9, wherein the crosslinking agent is at least one selected from compounds represented by Chemical Formulas 5 to 11 below:

[Chemical Formula 5]

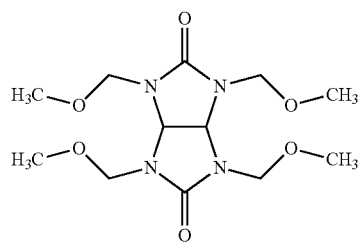

[Chemical Formula 6]

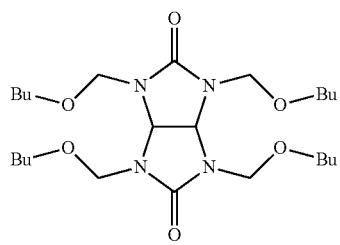

[Chemical Formula 7]

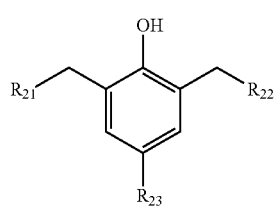

in Chemical Formula 7, $R_{21}$ and $R_{22}$ are each independently hydroxy or (C1-C3)alkoxy, and $R_{23}$ is (C1-C10)alkyl,

[Chemical Formula 8]

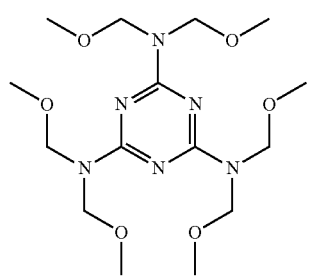

[Chemical Formula 9]

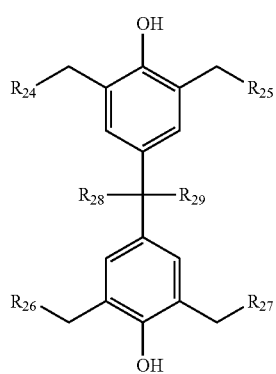

in Chemical Formula 9, $R_{24}$, $R_{25}$, $R_{26}$ and $R_{27}$ are each independently hydroxy or (C1-C3)alkoxy, and $R_{28}$ and $R_{29}$ are each independently hydrogen, (C1-C10)alkyl or halo(C1-C10)alkyl,

[Chemical Formula 10]

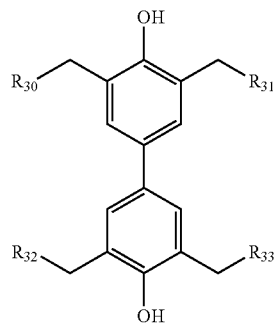

in Chemical Formula 10, $R_{30}$, $R_{31}$, $R_{32}$ and $R_{33}$ are each independently hydroxy or (C1-C3)alkoxy,

[Chemical Formula 11]

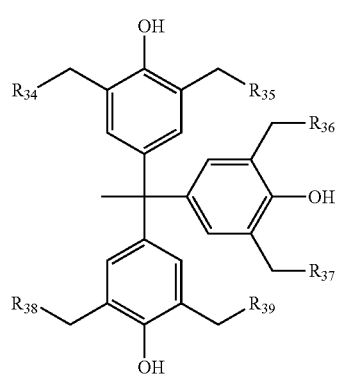

in Chemical Formula 11, $R_{34}$, $R_{35}$, $R_{36}$, $R_{37}$, $R_{38}$ and $R_{39}$ are each independently hydroxy or (C1-C3)alkoxy.

11. The resist underlayer film composition of claim 9, wherein the acid catalyst or the acid generator is at least one selected from compounds represented by Chemical Formulas 12 to 17 below:

[Chemical Formula 12]

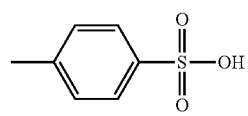

[Chemical Formula 13]

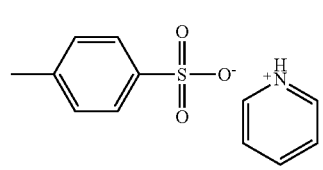

[Chemical Formula 14]

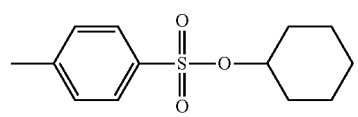

[Chemical Formula 15]

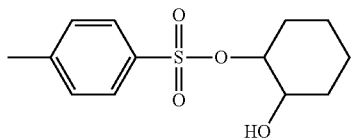

[Chemical Formula 16]

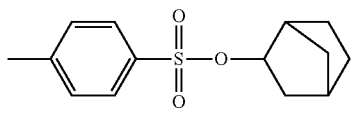

[Chemical Formula 17]

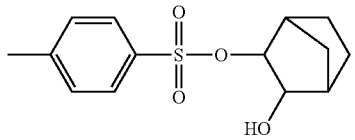

12. A method for manufacturing semiconductor device comprising:

1) forming a resist underlayer film by applying and heating the resist underlayer film composition of claim 5 on a substrate;
2) forming a photoresist film on the resist underlayer film of step 1);
3) forming photoresist patterns by exposing and developing the photoresist film of step 2);
4) etching the resist underlayer film by using the photoresist patterns of step 3) as an etching mask to thereby expose the substrate in a form of the patterns; and
5) etching an exposed part of the substrate,
wherein the exposing is performed by using at least one selected from the group consisting of far-ultraviolet rays, electron beam, X-ray, and ion beam, and
wherein the development is performed by using an alkaline aqueous solution.

13. The method for manufacturing semiconductor device of claim 12, further comprising, before step 2), forming an inorganic resist underlayer film or a bottom anti-refractive coating (BARC) film on the resist underlayer film of step 1).

14. The method for manufacturing semiconductor device of claim 12, wherein in the forming of the photoresist patterns of step 3), heating is performed before and/or after the exposing, respectively.

* * * * *